United States Patent
Suzuki

(10) Patent No.: US 8,830,103 B2
(45) Date of Patent: Sep. 9, 2014

(54) D/A CONVERTER

(71) Applicant: Fujitsu Semiconductor Limited, Yokohama (JP)

(72) Inventor: Hisao Suzuki, Nagoya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/776,058

(22) Filed: Feb. 25, 2013

(65) Prior Publication Data

US 2013/0222169 A1    Aug. 29, 2013

(30) Foreign Application Priority Data

Feb. 27, 2012   (JP) .................. 2012-040373

(51) Int. Cl.
    *H03M 1/78*   (2006.01)
    *H03M 1/68*   (2006.01)
(52) U.S. Cl.
    CPC ............... *H03M 1/785* (2013.01); *H03M 1/68* (2013.01)
    USPC .......................................... 341/154; 341/144
(58) Field of Classification Search
    USPC ................... 341/144, 145, 150, 154
    See application file for complete search history.

(56) References Cited

U.S. PATENT DOCUMENTS

| | | | | |
|---|---|---|---|---|
| 4,551,709 A | * | 11/1985 | Merchant et al. | 341/136 |
| 5,021,787 A | * | 6/1991 | Leduc | 341/150 |
| 5,274,376 A | * | 12/1993 | Phillips et al. | 341/150 |
| 6,768,440 B1 | * | 7/2004 | Troutman | 341/150 |
| 7,884,749 B2 | * | 2/2011 | Furuta et al. | 341/161 |

FOREIGN PATENT DOCUMENTS

| | | |
|---|---|---|
| JP | 56-146326 | 11/1981 |
| JP | 63-6170 B2 | 2/1988 |
| JP | 05-28402 A | 10/1993 |
| JP | 2003-224477 A | 8/2003 |

* cited by examiner

*Primary Examiner* — Brian Young
(74) *Attorney, Agent, or Firm* — Arent Fox LLP

(57) ABSTRACT

A digital-to-analog (D/A) converter includes D/A conversion circuits and an amplifier circuit coupled between the D/A conversion circuits. Each D/A conversion circuit includes an R-2R ladder type resistor network, first transistors coupled between the resistor network and a first wiring at a first voltage level, and second transistors coupled between the resistor network and a second wiring at a second voltage level. The sizes of the first transistors are set at a ratio of powers of 2. The sizes of second transistors are set at a ratio of powers of 2. The second transistors are respectively turned on and off complementarily to the first transistors according to the digital input signal.

6 Claims, 17 Drawing Sheets

Fig.3

When VD is 6.40V:

| Code | D5 | D4 | D3 | D2 | D1 | D0 | VA | VB | VOUT |
|---|---|---|---|---|---|---|---|---|---|
| 0 | L | L | L | L | L | L | 0.00 | 0.00 | 0.00 |
| 1 | L | L | L | L | L | H | 0.80 | 0.80 | 0.10 |
| 2 | L | L | L | L | H | L | 1.60 | 1.60 | 0.20 |
| 3 | L | L | L | L | H | H | 2.40 | 2.40 | 0.30 |
| 4 | L | L | L | H | L | L | 3.20 | 3.20 | 0.40 |
| 5 | L | L | L | H | L | H | 4.00 | 4.00 | 0.50 |
| 6 | L | L | L | H | H | L | 4.80 | 4.80 | 0.60 |
| 7 | L | L | L | H | H | H | 5.60 | 5.60 | 0.70 |
| 8 | L | L | H | L | L | L | 0.00 | 0.00 | 0.80 |
| 9 | L | L | H | L | L | H | 0.80 | 0.80 | 0.90 |
| ⋮ | ⋮ | ⋮ | ⋮ | ⋮ | ⋮ | ⋮ | ⋮ | ⋮ | ⋮ |
| 54 | H | H | L | H | H | L | 4.80 | 4.80 | 5.40 |
| 55 | H | H | L | H | H | H | 5.60 | 5.60 | 5.50 |
| 56 | H | H | H | L | L | L | 0.00 | 0.00 | 5.60 |
| 57 | H | H | H | L | L | H | 0.80 | 0.80 | 5.70 |
| 58 | H | H | H | L | H | L | 1.60 | 1.60 | 5.80 |
| 59 | H | H | H | L | H | H | 2.40 | 2.40 | 5.90 |
| 60 | H | H | H | H | L | L | 3.20 | 3.20 | 6.00 |
| 61 | H | H | H | H | L | H | 4.00 | 4.00 | 6.10 |
| 62 | H | H | H | H | H | L | 4.80 | 4.80 | 6.20 |
| 63 | H | H | H | H | H | H | 5.60 | 5.60 | 6.30 |

Unit:volt

Fig.9A
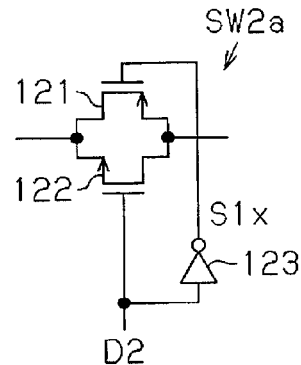
Fig.9B
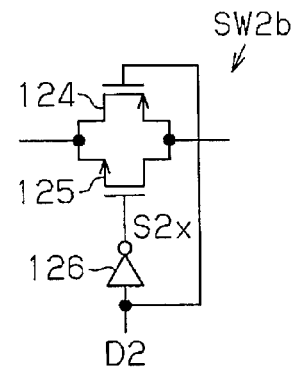
Fig.10
When VD is 6.40V:
| Code | D5 | D4 | D3 | D2 | D1 | D0 | VA | SW2a | SW2b | VB | VOUT |
|---|---|---|---|---|---|---|---|---|---|---|---|
| 0 | L | L | L | L | L | L | 0.00 | OFF | ON | 0.00 | 0.00 |
| 1 | L | L | L | L | L | H | 0.80 | OFF | ON | 0.80 | 0.10 |
| 2 | L | L | L | L | H | L | 1.60 | OFF | ON | 1.60 | 0.20 |
| 3 | L | L | L | L | H | H | 2.40 | OFF | ON | 2.40 | 0.30 |
| 4 | L | L | L | H | L | L | 3.20 | ON | OFF | 3.20 | 0.40 |
| 5 | L | L | L | H | L | H | 4.00 | ON | OFF | 4.00 | 0.50 |
| 6 | L | L | L | H | H | L | 4.80 | ON | OFF | 4.80 | 0.60 |
| 7 | L | L | L | H | H | H | 5.60 | ON | OFF | 5.60 | 0.70 |
| 8 | L | L | H | L | L | L | 0.00 | OFF | ON | 0.00 | 0.80 |
| 9 | L | L | H | L | L | H | 0.80 | OFF | ON | 0.80 | 0.90 |
| ⋮ | ⋮ | ⋮ | ⋮ | ⋮ | ⋮ | ⋮ | ⋮ | ⋮ | ⋮ | ⋮ | ⋮ |
| 54 | H | H | L | H | H | L | 4.80 | ON | OFF | 4.80 | 5.40 |
| 55 | H | H | L | H | H | H | 5.60 | ON | OFF | 5.60 | 5.50 |
| 56 | H | H | H | L | L | L | 0.00 | OFF | ON | 0.00 | 5.60 |
| 57 | H | H | H | L | L | H | 0.80 | OFF | ON | 0.80 | 5.70 |
| 58 | H | H | H | L | H | L | 1.60 | OFF | ON | 1.60 | 5.80 |
| 59 | H | H | H | L | H | H | 2.40 | OFF | ON | 2.40 | 5.90 |
| 60 | H | H | H | H | L | L | 3.20 | ON | OFF | 3.20 | 6.00 |
| 61 | H | H | H | H | L | H | 4.00 | ON | OFF | 4.00 | 6.10 |
| 62 | H | H | H | H | H | L | 4.80 | ON | OFF | 4.80 | 6.20 |
| 63 | H | H | H | H | H | H | 5.60 | ON | OFF | 5.60 | 6.30 |
Unit:volt

Fig.14

When VD is 6.40V:

| Code | D5 | D4 | D3 | D2 | D1 | D0 | VA | SW3a | SW3b | DL | VB | VOUT |
|---|---|---|---|---|---|---|---|---|---|---|---|---|
| 0 | L | L | L | L | L | L | 0.00 | OFF | OFF | H | 0.00 | 0.00 |
| 1 | L | L | L | L | L | H | 0.80 | OFF | ON | L | 0.80 | 0.10 |
| 2 | L | L | L | L | H | L | 1.60 | OFF | ON | L | 1.60 | 0.20 |
| 3 | L | L | L | L | H | H | 2.40 | OFF | ON | L | 2.40 | 0.30 |
| 4 | L | L | L | H | L | L | 3.20 | ON | OFF | L | 3.20 | 0.40 |
| 5 | L | L | L | H | L | H | 4.00 | ON | OFF | L | 4.00 | 0.50 |
| 6 | L | L | L | H | H | L | 4.80 | ON | OFF | L | 4.80 | 0.60 |
| 7 | L | L | L | H | H | H | 5.60 | ON | OFF | L | 5.60 | 0.70 |
| 8 | L | L | H | L | L | L | 0.00 | OFF | OFF | H | 0.00 | 0.80 |
| 9 | L | L | H | L | L | H | 0.80 | OFF | ON | L | 0.80 | 0.90 |
| ⋮ | ⋮ | ⋮ | ⋮ | ⋮ | ⋮ | ⋮ | ⋮ | ⋮ | ⋮ | ⋮ | ⋮ | ⋮ |
| 54 | H | H | L | H | H | L | 4.80 | ON | OFF | L | 4.80 | 5.40 |
| 55 | H | H | L | H | H | H | 5.60 | ON | OFF | L | 5.60 | 5.50 |
| 56 | H | H | H | L | L | L | 0.00 | OFF | OFF | H | 0.00 | 5.60 |
| 57 | H | H | H | L | L | H | 0.80 | OFF | ON | L | 0.80 | 5.70 |
| 58 | H | H | H | L | H | L | 1.60 | OFF | ON | L | 1.60 | 5.80 |
| 59 | H | H | H | L | H | H | 2.40 | OFF | ON | L | 2.40 | 5.90 |
| 60 | H | H | H | H | L | L | 3.20 | ON | OFF | L | 3.20 | 6.00 |
| 61 | H | H | H | H | L | H | 4.00 | ON | OFF | L | 4.00 | 6.10 |
| 62 | H | H | H | H | H | L | 4.80 | ON | OFF | L | 4.80 | 6.20 |
| 63 | H | H | H | H | H | H | 5.60 | ON | OFF | L | 5.60 | 6.30 |

Unit:volt

| Code | D2 | D1 | D0 | SCa | SCax | SCb | SCbx | DL |
|---|---|---|---|---|---|---|---|---|
| 0 | L | L | L | L | H | L | H | H |
| 1 | L | L | H | L | H | H | L | L |
| 2 | L | H | L | L | H | H | L | L |
| 3 | L | H | H | L | H | H | L | L |
| 4 | H | L | L | H | L | L | H | L |
| 5 | H | L | H | H | L | L | H | L |
| 6 | H | H | L | H | L | L | H | L |
| 7 | H | H | H | H | L | L | H | L |

Fig.20

| Code | D2 | D1 | D0 | DL | Output drain | | Output gate | | Feedback path | | Reference input | | Input gate | |
|---|---|---|---|---|---|---|---|---|---|---|---|---|---|---|
| | | | | | For High | For Low | For High | For Low | For High | For Low | For High | For Low | For High | For Low |
| | | | | | SWA | SWB | SWC | SWD | SWE | SWF | SWG | SWH | SWI | SWJ |
| 0 | L | L | L | H | OFF | OFF | OFF | OFF | ON | ON | ON | ON | OFF | OFF |
| 1 | L | L | H | L | OFF | ON | OFF | ON | ON | OFF | ON | OFF | OFF | ON |
| 2 | L | H | L | L | OFF | ON | OFF | ON | ON | OFF | ON | OFF | OFF | ON |
| 3 | L | H | H | L | OFF | ON | OFF | ON | ON | OFF | ON | OFF | OFF | ON |
| 4 | H | L | L | L | ON | OFF | ON | OFF | OFF | ON | OFF | ON | ON | OFF |
| 5 | H | L | H | L | ON | OFF | ON | OFF | OFF | ON | OFF | ON | ON | OFF |
| 6 | H | H | L | L | ON | OFF | ON | OFF | OFF | ON | OFF | ON | ON | OFF |
| 7 | H | H | H | L | ON | OFF | ON | OFF | OFF | ON | OFF | ON | ON | OFF |

Fig.21

When VD is 6.40V:

| Code | D2 | D1 | D0 | DL | Overall | | Input gate | | Output drain | | Output gate | |
|---|---|---|---|---|---|---|---|---|---|---|---|---|
| | | | | | Input | Output | For High | For Low | For High | For Low | For High | For Low |
| | | | | | VA | VB | V1H | V1L | V2H | V2L | V3H | V3L |
| 0 | L | L | L | H | 0.00 | 0.00 | VR | VR | VR | VR | VR | VR |
| 1 | L | L | H | L | 0.80 | 0.80 | VR | 0.80 | VR | Vf | VR | 0.80 |
| 2 | L | H | L | L | 1.60 | 1.60 | VR | 1.60 | VR | Vf | VR | 1.60 |
| 3 | L | H | H | L | 2.40 | 2.40 | VR | 2.40 | VR | Vf | VR | 2.40 |
| 4 | H | L | L | L | 3.20 | 3.20 | 3.20 | VR | Vf | VR | 3.20 | VR |
| 5 | H | L | H | L | 4.00 | 4.00 | 4.00 | VR | Vf | VR | 4.00 | VR |
| 6 | H | H | L | L | 4.80 | 4.80 | 4.80 | VR | Vf | VR | 4.80 | VR |
| 7 | H | H | H | L | 5.60 | 5.60 | 5.60 | VR | Vf | VR | 5.60 | VR |

Unit:volt

When VD is 6.40V:

| Code | D2 | D1 | D0 | VOUT |
|------|----|----|----|------|
| 0 | L | L | L | 0.00 |
| 1 | L | L | H | 0.80 |
| 2 | L | H | L | 1.60 |
| 3 | L | H | H | 2.40 |
| 4 | H | L | L | 3.20 |
| 5 | H | L | H | 4.00 |
| 6 | H | H | L | 4.80 |
| 7 | H | H | H | 5.60 |

Unit: volt

D/A CONVERTER

CROSS-REFERENCE TO RELATED APPLICATIONS

This application is based upon and claims the benefit of priority from prior Japanese Patent Application No. 2012-040373, filed on Feb. 27, 2012, the entire contents of which are incorporated herein by reference.

FIELD

The present disclosure relates to a digital-to-analog (D/A) converter.

BACKGROUND ART

One example of D/A converters for converting a digital signal into an analog signal is an R-2R type D/A converter using a ladder type resistor network.

As illustrated in FIG. 24, the R-2R type D/A converter includes a resistor network 301 and three switches 302 to 304 corresponding to digital input signals D0 to D2. Respective switches 302 to 304 include transistors 302a to 304a coupled between a wiring 311 at a high potential voltage VD level and the resistor network 301 and transistors 302b to 304b coupled between the resistor network 301 and a wiring 312 at a low potential voltage GND level. The transistors 302a to 304 and 302b to 304b are complementarily turned on and off according to the digital input signals D0 to D2.

The R-2R type D/A converter outputs an analog signal VOUT having a voltage value obtained by dividing a voltage difference between a high potential voltage VD and a low potential voltage GND by ON-resistances of resistance elements included in the resistor network 301 and the respective transistors 302a to 304a, 302b to 304b. For example, the R-2R type D/A converter outputs an analog signal VOUT having a voltage value corresponding to a code (decimal number) and the digital input signals D2 to D0 as illustrated in FIG. 25. In FIG. 25, the voltage value of the analog signal VOUT indicates a case where the high potential voltage VD=6.4V and the low potential voltage GND=0V. The code represents binary numbers represented by the digital input signals D0 to D2 in the form of a decimal number.

There is demand for D/A converters to correspond to multi-bit digital input signals to increase resolution. For example, a case of an R-2R type D/A converter is illustrated in FIG. 26. Another D/A converter includes a first-stage D/A conversion unit for generating a voltage corresponding to a high-order bit of a digital input signal and a next-stage D/A conversion unit for generating a voltage corresponding to a low-order bit of a digital input signal based on an output voltage of the first-stage D/A conversion unit. Reference is made, for example, to Japanese Laid-Open Patent Publication Nos. 2003-224477 and 5-248028 and Japanese Examined Patent Publication No. 63-6170.

SUMMARY

In the R-2R type D/A converter illustrated in FIG. 24, the sizes of the transistors 302a to 304a, 302b to 304b are weighted according to the digital input signals D0 to D2. In FIG. 24, numerical values illustrated lateral to the respective transistors 302a to 304a, 302b to 304b indicate transistor size ratios. "×1" indicates 1-fold, "×2" indicates 2-fold and "×4" indicates 4-fold.

The transistor sizes are weighted to suppress a reduction in the linearity of the analog signal VOUT. The value of a current flowing in the resistance elements included in the resistor network 301 varies depending on a set code (digital input signals D0 to D2). Thus, if the ON-resistance values of the respective transistors 302a to 304a, 302b to 304b are the same value, terminal voltages of the resistance elements coupled to the respective transistors 302a to 304a, 302b to 304b vary due to the current flowing in the resistance elements. This terminal voltage variation reduces the linearity of the analog signal VOUT.

Thus, in the R-2R type D/A converter, the areas of the transistors increase as the number of bits increases. For example, as illustrated in FIG. 26, the areas of transistors 305a to 307a, 305b to 307b of switches 305 to 307 corresponding to digital input signals D3, D4 and D5 are "×8" "×16" and "×32". For example, a 6-bit D/A converter includes transistors included in a 3-bit D/A converter and transistors having a size 8 times larger than the transistors included in the 3-bit D/A converter. That is, if the bit number of digital input signals is doubled, the area of the D/A converter is much larger than 2-fold.

A minimum size of transistors is limited by a manufacturing technology (miniaturization technology). Accordingly, the size of the transistors of "×1" illustrated in FIG. 24 is not smaller than the minimum size limited by the manufacturing technology. That is, a size reduction of the respective transistors is limited by the manufacturing technology. This becomes a factor in preventing an area reduction in multi-bit D/A converters.

According to an aspect of the embodiments, a digital-to-analog (D/A) converter which generates an analog signal corresponding to a digital input signal is provided. The D/A converter includes a plurality of D/A conversion circuits; and an amplifier circuit coupled between the plurality of D/A conversion circuits in a negative feedback manner. The plurality of D/A conversion circuits include a first-stage D/A conversion circuit configured to receive a multi-bit digital input signal including a least significant bit of the digital input signal, and another D/A conversion circuit configured to receive a higher-order but than a bit of a digital input signal received by a previous-stage D/A conversion circuit thereof. Each D/A conversion circuit includes an R-2R ladder type resistor network corresponding to the digital input signal received by the D/A conversion circuit, a plurality of first transistors which are coupled between the resistor network and a first wiring at a first voltage level and the sizes of which are set at a ratio of powers of 2, and a plurality of second transistors which are coupled between the resistor network and a second wiring at a second voltage level, the sizes of which are set at a ratio of powers of 2 and which are respectively turned on and off complementarily to the plurality of first transistors according to the digital input signal.

The object and advantages of the invention will be realized and attained by means of the elements and combinations of particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a table indicating the operation of the D/A converter,

FIGS. 9A and 9B are circuit diagrams of switches,

FIG. 10 is a table indicating the operation of the D/A converter,

FIG. 14 is a table indicating the operation of the D/A converter,

FIG. 20 is a table indicating a switch control, FIG. 21 is a table indicating the operation of a D/A converter.

DESCRIPTION OF EMBODIMENTS

A first embodiment will be described with reference to FIGS. 1 to 5.

Figure 1:
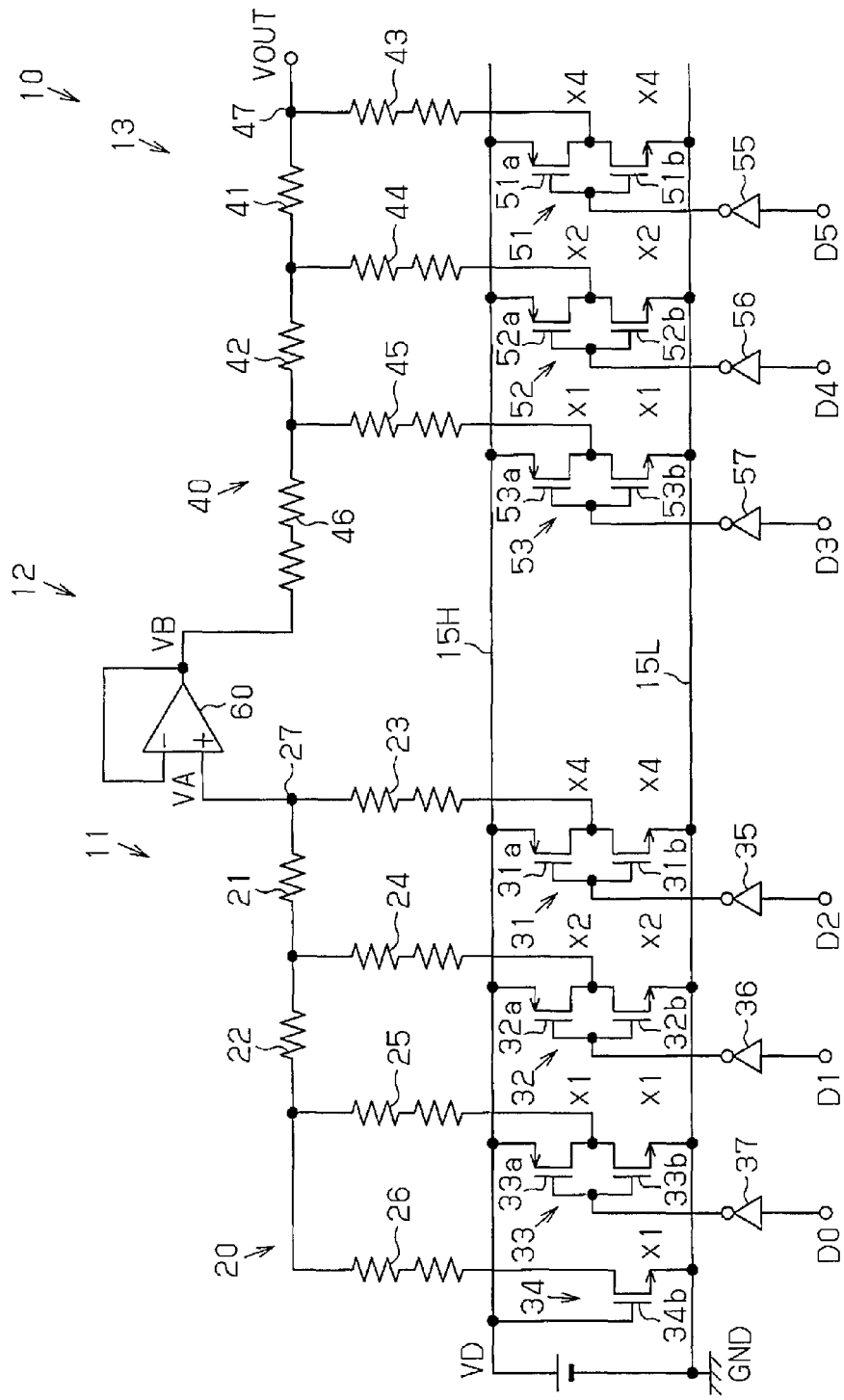
FIG. 1 is a circuit diagram of a D/A converter.

FIG. 1 illustrates a D/A converter 10 that outputs an analog signal VOUT having a voltage value corresponding to six bits digital input signals D5 to D0. In the illustrated embodiment, the signal D5 is a most significant bit (MSB) and the signal D0 is a least significant bit (LSB).

The D/A converter 10 includes two D/A conversion circuits 11, 13 and a buffer circuit 12.

The first D/A conversion circuit 11 outputs an analog signal VA of a voltage obtained by dividing a potential difference between a high potential voltage VD and a low potential voltage GND according to the digital input signals D2 to D0 of lower three bits out of the digital input signals D5 to D0.

The buffer circuit 12 outputs an analog signal VB of a voltage equal to the analog signal VA output from the first D/A conversion circuit 11.

The second D/A conversion circuit 13 outputs an analog signal VOUT of a voltage based on a voltage obtained by dividing a potential difference between the high potential voltage VD and the low potential voltage GND according to digital input signals D5 to D3 of upper three bits out of the digital input signals D5 to D0 and the voltage of the analog signal VB (analog signal VA of the first D/A conversion circuit 11) output from the buffer circuit 12.

The first D/A conversion circuit 11 is an R-2R ladder resistor type D/A conversion circuit and includes a resistor network 20. The resistor network 20 includes resistors 21 to 26. Resistance values of the resistors 21, 22 are equal to each other and set at a predetermined resistance value R. The resistors 21, 22 are an example of first resistors. Resistance values of the resistors 23 to 25 are set at twice the resistance value R (2R) of the resistors 21, 22. The resistors 23 to are an example of second resistors and the resistor 26 is an example of a third resistor. In FIG. 1, the resistors 21, 22 are illustrated by one resistor symbol and the resistors 23 to 26 are illustrated by two resistor symbols to make the resistance values of the respective resistors 21 to 26 clear. The resistor 23 to 26 having the resistance value 2R may be configured by connecting two resistors having the resistance value R in series.

The resistors 21, 22 are coupled in series to each other. First terminals of the resistors 23 to 26 are coupled to respective nodes of the resistors 21, 22. For example, a first terminal (right terminal in FIG. 1) of the resistor 21 is coupled to the first terminal of the resistor 23, a node between a second terminal of the resistor 21 and a first terminal (right terminal in FIG. 1) of the resistor 22 is coupled to the first terminal of the resistor 24 and a second terminal of the resistor 22 is coupled to the first terminal of the resistor 25. Further, the second terminal of the resistor 22 is coupled to the first terminal of the resistor 26.

Second terminals of the resistors 23 to 26 are respectively coupled to switches 31 to 34.

The switch 31 includes two transistors 31a, 31b. The transistor 31a is, for example, a P-channel MOS transistor and the transistor 31b is, for example, an N-channel MOS transistor. A source terminal of the transistor 31a is coupled to a wiring 15H at a high potential voltage VD level and a drain terminal of the transistor 31a is coupled to the second terminal of the resistor 23 and a drain terminal of the transistor 31b. A source terminal of the transistor 31b is coupled to a wiring 15L at a low potential voltage GND level. A gate terminal of the transistor 31a is coupled to a gate terminal of the transistor 31b and an output terminal of an inverter circuit 35 and the digital input signal D2 is supplied to an input terminal of the inverter circuit 35.

The both transistors 31a, 31b are complementarily turned on and off in accordance with a logic level ("1" or "0") of the digital input signal D2. When the transistor 31a is turned on, the high potential voltage VD is supplied to the second terminal of the resistor 23. When the transistor 31b is turned on, the low potential voltage GND is supplied to the second terminal of the resistor 23.

Similarly, the switch 32 includes two transistors 32a, 32b coupled in series between the wiring 15H and 15L. The transistor 32a is, for example, a P-channel MOS transistor and the transistor 32b is, for example, an N-channel MOS transistor. Drain terminals of the both transistors 32a, 32b are coupled to each other and a connection point thereof is coupled to the second terminal of the resistor 24. Gate terminals of the transistors 32a, 32b are coupled to each other, a connection point thereof is coupled to an output terminal of an inverter circuit 36 and the digital input signal D1 is supplied to an input terminal of the inverter circuit 36. Thus, the both transistors 32a, 32b are complementarily turned on and off in accordance with a logic level ("1" or "0") of the digital input signal DL. When the transistor 32a is turned on, the high potential voltage VD is supplied to the second terminal of the resistor 24. When the transistor 32b is turned on, the low potential voltage GND is supplied to the second terminal of the resistor 24.

Similarly, the switch 33 includes two transistors 33a, 33b coupled in series between the wiring 15H and 15L. The transistor 33a is, for example, a P-channel MOS transistor and the transistor 33b is, for example, an N-channel MOS transistor.

Drain terminals of the both transistors 33a, 33b are coupled to each other and a connection point thereof is coupled to the second terminal of the resistor 25. Gate terminals of the transistors 33a, 33b are coupled to each other, a connection point thereof is coupled to an output terminal of an inverter circuit 37 and the digital input signal D0 is supplied to an input terminal of the inverter circuit 37. Thus, the both transistors 33a, 33b are complementarily turned on and off in accordance with a logic level ("1" or "0") of the digital input signal D0. When the transistor 33a is turned on, the high potential voltage VD is supplied to the second terminal of the resistor 25. When the transistor 33b is turned on, the low potential voltage GND is supplied to the second terminal of the resistor 25. In the illustrated embodiment, the wirings 15H and 15L are an example of a first wiring at a first voltage level and a second wiring at a second voltage level. The transistors 31a, 32a and 33a are an example of a plurality of first transistors. The transistors 31b, 32b and 33b are an example of a plurality of second transistors.

The switch 34 to which the second terminal of the resistor 26 is coupled includes a transistor 34b. The transistor 34b is, for example, an N-channel MOS transistor. A drain terminal of the transistor 34b is coupled to the second terminal of the resistor 26, a source terminal is coupled to the wiring 15L and a gate terminal is coupled to the wiring 15H. Thus, the transistor 34b is turned on and the low potential voltage GND is supplied to the second terminal of the resistor 26.

In the R-2R ladder resistor type D/A conversion circuit, ON-resistance values of the respective transistors 31a to 33a, 31b to 33b are ideally 0 (zero) Ω. This is because it is ideal that terminal voltages of the resistors coupled to the wirings 15H, 15L via the transistors are equal to each other. Further, in the R-2R ladder resistor type D/A conversion circuit, the amounts of current flowing in the respective resistors 21 to 26 change according to a set code, i.e. values ("0" or "1") of the digital input signals D2 to D0. If the ON-resistance values of the respective transistors are equal to each other, a change in the amounts of current leads to a variation in the terminal voltages of the resistors 23 to 26.

Thus, the sizes of the respective transistors 31a to 33a, 31b to 34b are weighted according to the digital input signals D2 to D0. For example, the size of the transistor 33a is set to be a standard size (×1), and that of the transistor 32a is set to be twice (×2) larger and that of the transistor 31a is set to be four times (×4) larger than the standard size. Similarly, the size of the transistor 32b is set to be twice (×2) larger and that of the transistor 31b is set to be four times (×4) larger than the size (×1) of the transistor 33b. The size of the transistor 34b is set to be equal (×1) to that of the transistor 33b.

The transistor 32a the size of which is set to be twice larger may be, for example, comprised of two transistors formed to have the same size as the transistor 33a and coupled in parallel to each other. Similarly, the transistor 31a the size of which is set to be four times larger may be, for example, comprised of four transistors formed to have the same size as the transistor 33a and coupled in parallel to each other. Similarly, the transistor 32b the size of which is set to be twice larger may be, for example, comprised of two transistors formed to have the same size as the transistor 33b and coupled in parallel to each other. Further, the transistor 31b the size of which is set to be four times larger may be, for example, comprised of four transistors formed to have the same size as the transistor 33b and coupled in parallel to each other.

The respective switches 31 to 33 connect the second terminals of the resistors 23 to 25 to either one of the wiring 15H at the high potential voltage VD level and the wiring 15L at the low potential voltage GND level according to the digital input signals D2 to D0. In this way, the first D/A conversion circuit 11 generates the analog signal VA having the voltage obtained by dividing the potential difference between the high potential voltage VD and the low potential voltage GND by the resistance values of the respective resistors 21 to 26 and the ON-resistance value of the turned-on transistor.

The buffer circuit 12 includes an operational amplifier 60. A non-inverting input terminal of this operational amplifier 60 is coupled to a node 27 (output node) between the resistors 21 and 23 included in the resistor network 20 of the first D/A converter 11 and the analog signal VA is supplied thereto. An output terminal and an inverting input terminal of the operational amplifier 60 are coupled to each other to serve as a voltage follower. This operational amplifier 60 outputs the analog signal VB having a voltage equal to the signal VA.

Similarly to the first D/A conversion circuit 11, the second D/A conversion circuit 13 is an R-2R ladder resistor type D/A conversion circuit and includes a resistor network 40. The resistor network 40 includes resistors 41 to 46. The resistors 41, 42 are coupled in series to each other. The resistors 41, 42 are an example of the first resistors. The resistors 43 to 45 are an example of the second resistors and the resistor 46 is an example of the third resistor. First terminals of the resistors 43 to 46 are coupled to respective nodes of the resistors 41, 42. For example, a first terminal (right terminal in FIG. 1) of the resistor 41 is coupled to the first terminal of the resistor 43, a node between a second terminal of the resistor 41 and a first terminal (right terminal in FIG. 1) of the resistor 42 is coupled to the first terminal of the resistor 44, and a second terminal of the resistor 42 is coupled to the first terminal of the resistor 45. Further, the second terminal of the resistor 42 is coupled to the first terminal of the resistor 46. A second terminal of the resistor 46 is coupled to an output terminal of the buffer circuit 12 (output terminal of the operational amplifier 60).

Second terminals of the resistor 43 to 45 are coupled to switches 51 to 53.

The switch 51 includes two transistors 51a, 51b. The transistor 51a is, for example, a P-channel MOS transistor and the transistor 51b is, for example, an N-channel MOS transistor. A source terminal of the transistor 51a is coupled to the wiring 15H at the high potential voltage VD level and a drain terminal thereof is coupled to the second terminal of the resistor 43 and a drain terminal of the transistor 51b. A source terminal of the transistor 51b is coupled to the wiring 15L at the low potential voltage GND level. A gate terminal of the transistor 51a is coupled to a gate terminal of the transistor 51b and an output terminal of an inverter circuit 55 and the digital input signal D5 is supplied to an input terminal of an inverter circuit 55.

The both transistors 51a, 51b are complementarily turned on and off in accordance with a logic level ("1" or "0") of the digital input signal D5. When the transistor 51a is turned on, the high potential voltage VD is supplied to the second terminal of the resistor 43. When the transistor 51b is turned on, the low potential voltage GND is supplied to the second terminal of the resistor 43.

Similarly, the switch 52 includes two transistors 52a, 52b coupled in series between the wiring 15H and 15L. The transistor 52a is, for example, a P-channel MOS transistor and the transistor 52b is, for example, an N-channel MOS transistor. Drain terminals of the both transistors 52a, 52b are coupled to each other and a connection point thereof is coupled to the second terminal of the resistor 44. Gate terminals of the transistors 52a, 52b are coupled to each other, a connection point thereof is coupled to an output terminal of an inverter circuit 56 and the digital input signal D4 is supplied to an input terminal of the inverter circuit 56. Thus, the both transistors 52a, 52b are complementarily turned on and off in accordance with a logic level ("1" or "0") of the digital input signal D4. When the transistor 52a is turned on, the high potential voltage VD is supplied to the second terminal of the resistor 44. When the transistor 52b is turned on, the low potential voltage GND is supplied to the second terminal of the resistor 44.

Similarly, the switch 53 includes two transistors 53a, 53b coupled in series between the wiring 15H and 15L. The transistor 53a is, for example, a P-channel MOS transistor and the transistor 53b is, for example, an N-channel MOS transistor. Drain terminals of the both transistors 53a, 53b are coupled to each other and a connection point thereof is coupled to the second terminal of the resistor 45. Gate terminals of the transistors 53a, 53b are coupled to each other, a connection point thereof is coupled to an output terminal of an inverter circuit 57 and the digital input signal D3 is supplied to an input terminal of the inverter circuit 57. Thus, the both transistors 53a, 53b are complementarily turned on and off in accordance with a logic level ("1" or "0") of the digital input signal D3. When the transistor 53a is turned on, the high potential voltage VD is supplied to the second terminal of the resistor 45. When the transistor 53b is turned on, the low potential voltage GND is supplied to the second terminal of the resistor 45.

In the R-2R ladder resistor type D/A conversion circuit, ON-resistance values of the respective transistors 51a to 53a, 51b to 54b are ideally 0 (zero) Q. This is because it is ideal that terminal voltages of the resistors coupled to the wirings 15H, 15L via the transistors are equal to each other. Further, in the R-2R ladder resistor type D/A conversion circuit, the amounts of current flowing in the respective resistors 41 to 46 change according to a set code, i.e. values ("0" or "1") of the digital input signals D5 to D3. If the ON-resistance values of the respective transistors are equal to each other, a change in the amounts of current leads to a variation in the terminal voltages of the resistors 43 to 46.

Thus, the sizes of the respective transistors 51a to 53a, 51b to 53b are weighted according to the digital input signals D5 to D3. For example, the size of the transistor 53a is set to be a standard size (×1), and that of the transistor 52a is set to be twice (×2) larger and that of the transistor 51a is set to be four times (×4) larger than the standard size. Similarly, the size of the transistor 52b is set to be twice (×2) larger and that of the transistor 51b is set to be four times (×4) larger than the size (×1) of the transistor 53b.

The transistor 52a the size of which is set to be twice larger may be, for example, comprised of two transistors formed to have the same size as the transistor 53a and coupled in parallel to each other. Similarly, the transistor 51a the size of which is set to be four times larger may be, for example, comprised of four transistors formed to have the same size as the transistor 53a and coupled in parallel to each other. Similarly, the transistor 52b the size of which is set to be twice larger may be, for example, comprised of two transistors formed to have the same size as the transistor 53b and coupled in parallel to each other. Further, the transistor 51b the size of which is set to be four times larger may be, for example, comprised of four transistors formed to have the same size as the transistor 53b and coupled in parallel to each other.

The respective switches 51 to 53 connect the second terminals of the resistors 43 to 45 to either one of the wiring 15H at the high potential voltage VD level and the wiring 15L at the low potential voltage GND level according to the digital input signals D3 to D5. In this way, the second D/A conversion circuit 13 generates a voltage obtained by dividing the potential difference between the high potential voltage VD and the low potential voltage GND by the resistance values of the respective resistors 41 to 46 and the ON-resistance value of the turned-on transistor.

The analog signal VB applied to the second terminal of the resistor 46 by the buffer circuit 12 causes an offset voltage to be generated at the output node 47. This offset voltage is based on the configuration of the resistor network 40, i.e. the bit number "3" of the digital input signals D5 to D3 of the second D/A conversion circuit 13 and the analog signal VB. For example, the offset voltage is equal to a value obtained by dividing the analog signal VB by 2 to the power of the bit number.

A configuration example of the operational amplifier 60 will be described.

Figure 2:
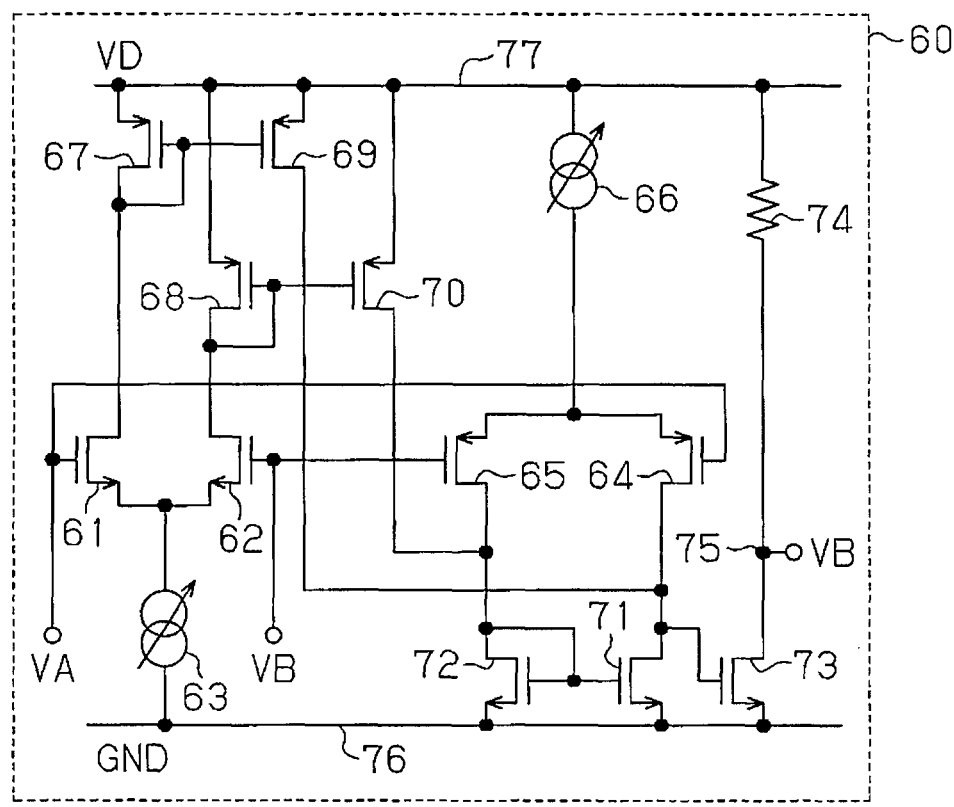
FIG. 2 is a circuit diagram of an operational amplifier.

As illustrated in FIG. 2, the analog signal VA is applied to a gate terminal of a transistor 61 of a first differential pair and the analog signal VB is applied to a gate terminal of a transistor 62 of the first differential pair. The transistors 61, 62 are, for example, N-channel MOS transistors. Source terminals of the transistors 61, 62 are coupled to each other, a connection point thereof is coupled to a first terminal of a current source 63 from which a bias current for the transistors 61, 62 flows, and a second terminal of the current source 63 is coupled to a wiring 76 at the low potential voltage GND level.

Further, the analog signal VA is applied to a gate terminal of a transistor 64 of a second differential pair and the analog signal VB is applied to a gate terminal of a transistor 65 of the second differential pair. The transistors 64, 65 are, for example, P-channel MOS transistors. Source terminals of the transistors 64, 65 are coupled to each other, a connection point thereof is coupled to a second terminal of a current source 66 from which a bias current for the transistors 64, 65 flows, and a first terminal of the current source 66 is coupled to a wiring 77 at the high potential voltage VD level.

Drain terminals of the transistors 61, 62 are respectively coupled to transistors 67, 68. The transistors 67, 68 are, for example, P-channel MOS transistors. A drain terminal of the transistor 67 is coupled to a drain terminal of the transistor 61 and a source terminal is coupled to the wiring 77. Further, a drain terminal of the transistor 67 is coupled to a gate terminal of the transistor 67 and a gate terminal of a transistor 69. The transistor 69 is, for example, a P-channel MOS transistor. A source terminal of the transistor 69 is coupled to the wiring 77 and a drain terminal is coupled to a transistor 71.

Similarly, a drain terminal of the transistor 68 is coupled to the drain terminal of the transistor 62 and a source terminal is coupled to the wiring 77. Further, the drain terminal of the transistor 68 is coupled to a gate terminal of the transistor 68 and a gate terminal of a transistor 70. The transistor 70 is, for example a P-channel MOS transistor. A source terminal of the transistor 70 is coupled to the wiring 77 and a drain terminal is coupled to the transistor 72.

The transistors 71, 72 are, for example, N-channel MOS transistors. Source terminals of the transistors 71, 72 are coupled to the wiring 76. A drain terminal of the transistor 71 is coupled to a drain terminal of the transistor 64 and a drain terminal of the transistor 72 is coupled to a drain terminal of the transistor 65. Further, the drain terminal of the transistor 72 is coupled to a gate terminal of the transistor 72 and a gate terminal of the transistor 71.

The drain terminal of the transistor 71 is coupled to a gate terminal of a transistor 73 at an output stage. The transistor 73 is, for example, an N-channel MOS transistor. A source terminal of the transistor 73 is coupled to the wiring 76, a drain terminal is coupled to a second terminal of a resistor 74 and a first terminal of the resistor 74 is coupled to the wiring 77. The analog signal VB is output from an output node 75 between the resistor 74 and the transistor 73.

An input/output voltage range of the operational amplifier 60 is a supply voltage range (range from the low potential voltage GND to the high potential voltage VD). This operational amplifier 60 is an example of a rail-to-rail type operational amplifier circuit.

Functions of the D/A converter 10 will be described.

Figures 4, 5:
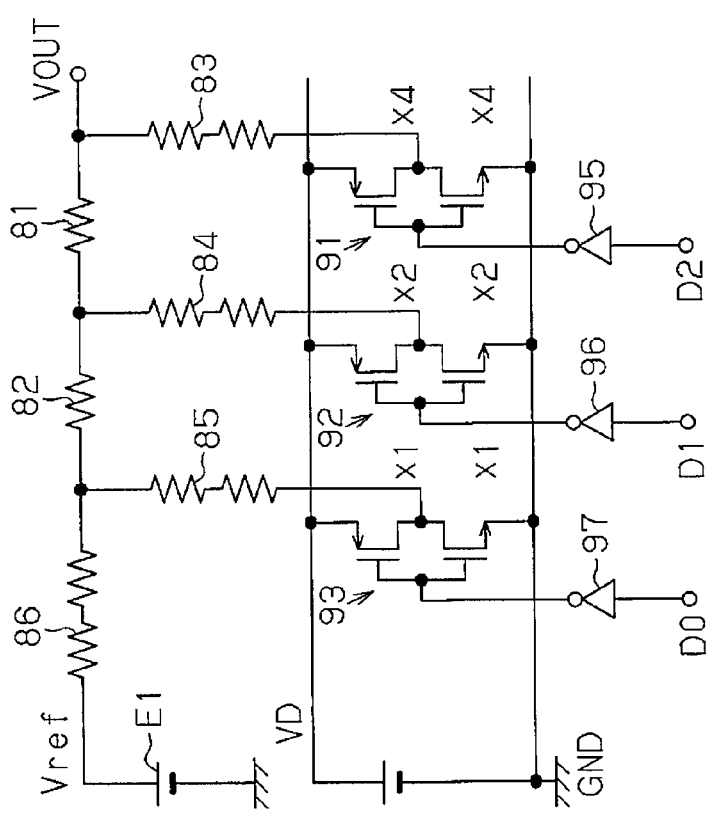
FIG. 4 is a circuit diagram of the D/A converterter.
FIG. 5 is an operation explanatory diagram of the D/A converter.

FIG. 4 is a circuit diagram of the D/A converter corresponding to the digital input signals D2 to D0 of three bits. This D/A converter includes a resistor network with resistors 81 to 86. The resistors 81 to 86 are respectively set at the same resistance values as the resistors 21 to 26 illustrated in FIG. 1. Further, this D/A converter includes switches 91 to 93 for supplying either one of the high potential voltage VD and the low potential voltage GND to second terminals (lower terminals in FIG. 4) of the resistors 83 to 85 according to the digital input signals D2 to D0, and inverter circuits 95 to 97. The switches 91 to 93 are similar to the switches 31 to 33 illustrated in FIG. 1.

In this D/A conversion circuit, a voltage source E1 is coupled to the resistor 86. This voltage source E1 is a variable voltage source and supplies a reference voltage Vref to the resistor 86. Further, this voltage source E1 has a sufficiently low impedance for the D/A conversion circuit and enables the inflow/outflow (sink/source) of a current into and from the resistor 86 without causing a variation in the voltage value of the reference voltage Vref.

Figures 24, 25:
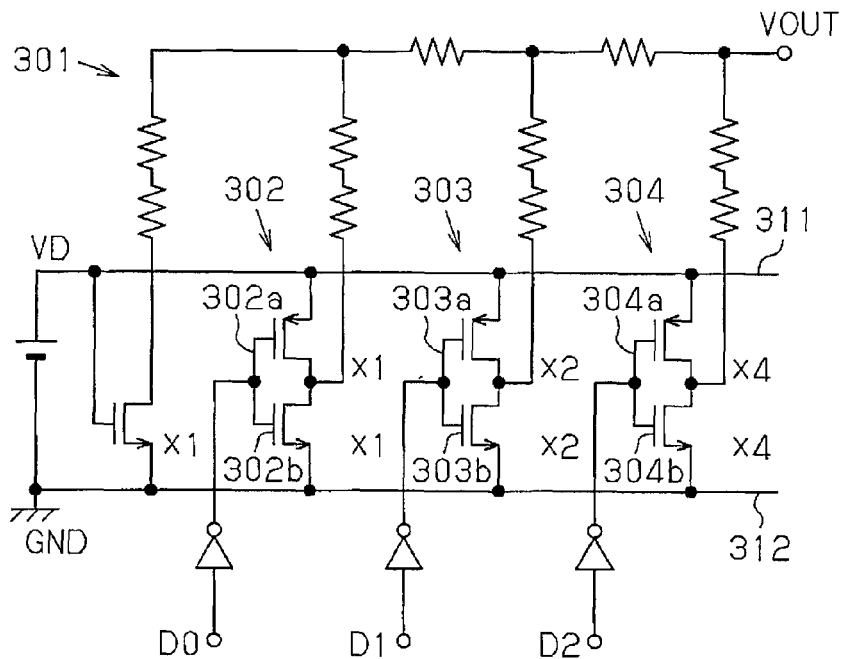
FIG. 24 is a circuit diagram of a D/A converter.
FIG. 25 is a table indicating the operation of the D/A converter of FIG. 24.

As an example, the reference voltage Vref is set at the low potential voltage GND (0 (zero) V). At this time, the D/A conversion circuit operates similarly to the D/A converter illustrated in FIG. 24. Thus, the analog signal VOUT has voltage values illustrated in FIG. 25.

Subsequently, the reference voltage Vref is set at an intermediate voltage between the high potential voltage VD and the low potential voltage GND. For example, if the high potential voltage VD is 6.40V and the low potential voltage GND is 0V, the reference voltage Vref is 3.2V. For example, if the respective bits of the digital input signals D2 to D0 are [000], the analog signal VOUT is 0.40V. Further, if the respective bits of the digital input signals D2 to D0 are [001], the analog signal VOUT is 1.20V. The respective voltage values when the reference voltage Vref is 0V are 0V, 0.8V.

Accordingly, this D/A conversion circuit sets a value obtained by dividing the reference voltage Vref by 2 to the power of the bit number "3" ($2^3$) as an offset value (=Vref/8). Then, the D/A conversion circuit outputs the analog signal VOUT having a voltage which is the sum of the voltage obtained by dividing the potential difference between the high potential voltage VD and the low potential voltage GND according to the digital input signals D2 to D0 and the offset value.

The analog signal VOUT may have 16 values as illustrated in FIG. 5 by combinations of logical values of the digital input signals D2 to D0 and the reference voltage Vref. That is, the D/A conversion circuit outputs the analog signal VOUT corresponding to digital input signals of four bits by applying two types (0V, 3.2V) of the reference voltage Vref.

The first D/A conversion circuit 11 illustrated in FIG. 1 outputs the analog signal VA having the voltage value obtained by dividing the potential difference between the high potential voltage VD and the low potential voltage GND according to the digital input signals D2 to D0 of three bits. The buffer circuit 12 outputs the signal VB having a voltage equal to the analog signal VA of the first D/A conversion circuit 11. In the second D/A conversion circuit 13, the analog signal VB of the buffer circuit 12 is applied to the resistor 46 as in the D/A conversion circuit illustrated in FIG. 4.

Accordingly, the second D/A conversion circuit 13 sets a value obtained by dividing the analog signal VB (=analog signal VA) of the buffer circuit 12 by 2 to the power of the bit number "3" ($2^3$) as an offset value (=VB/8=VA/8). Then, the second D/A conversion circuit 13 outputs the analog signal VOUT having a voltage which is the sum of the voltage obtained by dividing the potential difference between the high potential voltage VD and the low potential voltage GND according to the digital input signals D5 to D3 and the offset value. In this way, the D/A converter 10 outputs the analog signal VOUT having a voltage value obtained by dividing the potential difference between the high potential voltage VD and the low potential voltage GND according to the digital input signals D5 to D0 of six bits. FIG. 3 illustrates voltage values of the digital input signals D5 to D0 and the analog signal VOUT when the high potential voltage VD=6.4V and the low potential voltage GND=0V. Codes represent binary numbers indicated by the digital input signal D5 to D0 in the form of decimal numbers.

Further, the first D/A conversion circuit 11 is coupled to an input terminal of the buffer circuit 12 and the output terminal of the buffer circuit 12 is coupled to the second D/A conversion circuit 13. That is, the D/A converter 10 corresponding to the digital input signals D5 to D0 of six bits is divided into the first D/A conversion circuit 11 corresponding to the digital input signals D2 to D0 which are the lower three bits and the second D/A conversion circuit 13 corresponding to the digital input signals D5 to D3 which are the upper three bits by the buffer circuit 12.

The buffer circuit 12 includes the operational amplifier 60, to the inverting input terminal of which the analog signal VB is fed back, i.e. a voltage follower circuit. Such a buffer circuit 12 outputs the signal VB having a voltage value equal to that of the analog signal VA of the first D/A conversion circuit 11 without depending on the current flowing in the second D/A conversion circuit 13. That is, the current flowing in the second D/A conversion circuit 13 does not affect the first D/A conversion circuit 11.

Accordingly, the first and second D/A conversion circuits 11, 13 need not have a correlational relationship in the sizes of the transistors thereof. That is, the first and second D/A conversion circuits 11, 13 only have to include transistors of sizes corresponding to digital input signals in them. For example, the transistors 51a, 51b which respond to the digital input signal D5 which is the most significant bit only have to have the size four times (×4) larger than the transistors 53a, 53b which responds to the digital input signal D3 which is the least significant bit in the second D/A conversion circuit 13 and need not have the size 32 times (×32, see FIG. 26) larger than the size of the transistors 33a, 33b which respond to the digital input signal D0 which is the least significant bit.

In this way, each D/A conversion circuit 11, 13 includes the transistors of the sizes corresponding to the digital input signals in them. For example, the sizes of the transistors 33a, 33b, 53a, 53b which respond to the input signals D0, D3 which are the least significant bits in the respective first and second D/A conversion circuits 11, 13 may be a minimum size producible in a manufacturing process. Then, the area of a region where the second D/A conversion circuit 13 is formed is equal to that of a region where the first D/A conversion circuit 11 is formed. Therefore, the area of this 6-bit D/A converter 10 is smaller than that of the D/A converter illustrated in FIG. 26.

Relative accuracy of characteristics (ON-resistance values, etc.) among a plurality of transistors demonstrates a tendency to be proportional to an inverse of a square root of an element area. Accordingly, it becomes possible to obtain transistors with high relative accuracy by increasing the transistor sizes. Thus, even if the sizes of the transistors included in the respective first and second D/A conversion circuits 11, 13 are, for example, twice larger than the minimum size producible in the manufacturing process, it becomes possible to form a D/A converter having an area smaller than the area of the D/A converter illustrated in FIG. 26.

As described above, the following effects are achieved according to this embodiment.

(1) The D/A converter 10 outputs the analog signal VOUT having a voltage value corresponding to the digital input signals D5 to D0 of six bits. The D/A converter 10 includes the first D/A conversion circuit 11 to which the digital input signals D2 to D0 are supplied and the second D/A conversion circuit 13 to which the digital input signals D5 to D3 are supplied. The first and second D/A conversion circuits 11, 13 are coupled via the buffer circuit 12. The buffer circuit 12 includes the operational amplifier (amplifier circuit) 60 having a negative feedback configuration and outputs the analog signal VB having a voltage equal to the analog signal VA of the first D/A conversion circuit 11.

The buffer circuit 12 outputs the signal VB having a voltage value equal to that of the analog signal VA of the D/A conversion circuit 11 without depending on the current flowing in the second D/A conversion circuit 13. That is, the current flowing in the second D/A conversion circuit 13 does not affect the first D/A conversion circuit 11. Thus, the first and second D/A conversion circuits 11, 13 need not have a correlational relationship in the sizes of the transistors thereof. That is, the first and second D/A conversion circuits 11, 13 may include transistors of sizes corresponding to digital input signals in them.

In this way, the sizes of the transistors 51a to 53a, 51b to 53b corresponding to the high-order digital input signals D5 to D3 may be made smaller than in conventional examples. Thus, it is possible to suppress an increase in the area of the D/A converter due to an increase in the bit number of digital input signals.

(2) In the first D/A conversion circuit 11, the sizes of the transistors 31a, 31b, 32a, 32b corresponding to the digital input signals D2, D1 are set at ratios of powers of 2 (×4, ×2) with respect to the size of the transistors 33a, 33b corresponding to the digital input signal D0 which is the least significant bit. Similarly, in second D/A conversion circuit 13, the sizes of the transistors 51a, 51b, 52a, 52b corresponding to the digital input signals D5, D4 are set at ratios of powers of 2 (×4, ×2) with respect to the size of the transistors 53a, 53b corresponding to the digital input signal D3 which is the least significant bit.

Figure 26:
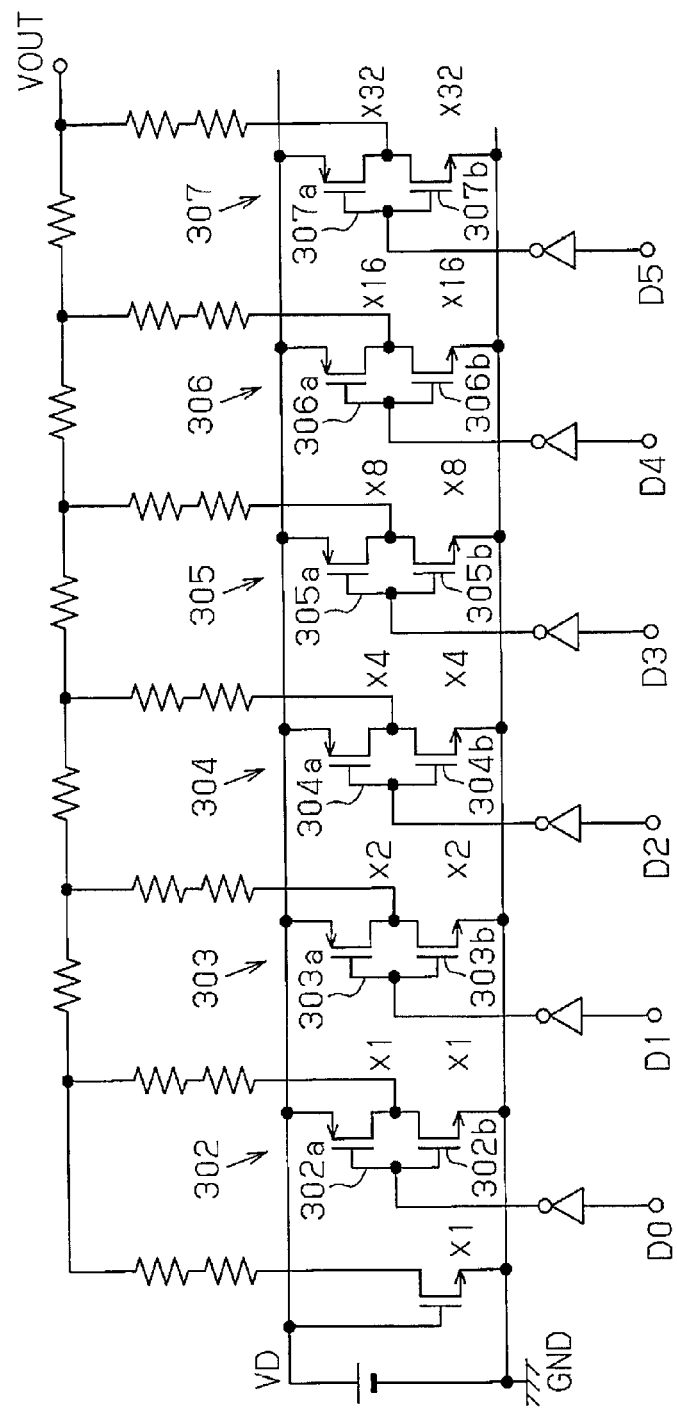
FIG. 26 is a circuit diagram of a D/A converter.

Accordingly, even if the sizes of the transistors 33a, 33b, 53a, 53b corresponding to the least significant digital input signals D0, D3 are made larger than the minimum size limited by the manufacturing technology in the respective D/A conversion circuits 11, 13, the area of the entire D/A converter 10 is sufficiently smaller than that of the 6-bit D/A converter illustrated in FIG. 26. Therefore, the D/A converter 10 may be formed without being limited by the manufacturing technology.

A second embodiment will be described with reference to FIGS. 6 to 10.

In the illustrated embodiment, the same components as in the above embodiment are denoted by the same reference signs and all or some of them are not described.

Figure 6:
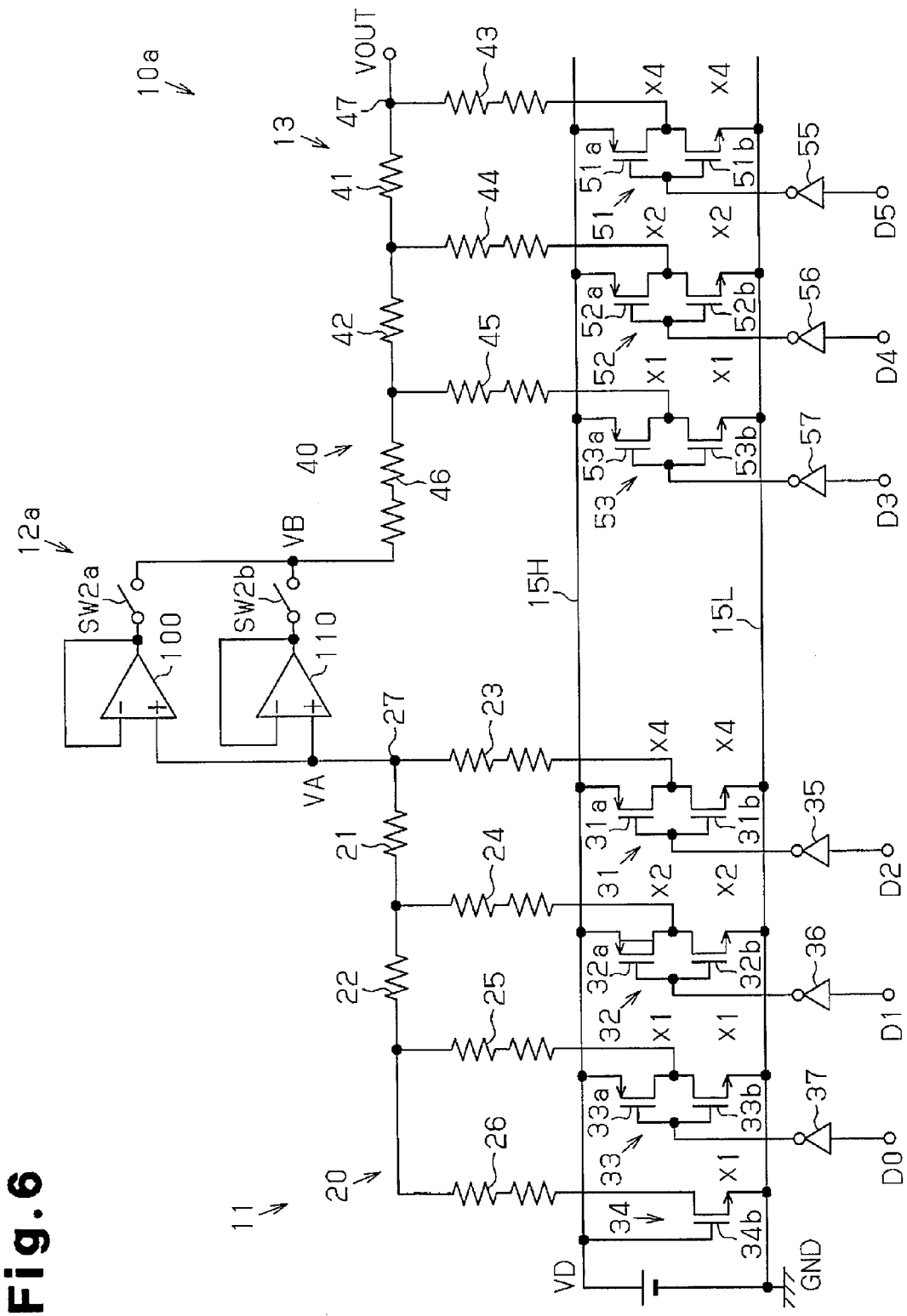
FIG. 6 is a circuit diagram of a D/A converter.

As illustrated in FIG. 6, a D/A converter 10a includes a first D/A conversion circuit 11, a buffer circuit 12a and a second D/A conversion circuit 13.

As illustrated in FIG. 6, the buffer circuit 12a includes two operational amplifiers 100, 110 and two switches SW2a, SW2b. The operational amplifier 100 is an example of a first amplifier circuit and the operational amplifier 110 is an example of a second amplifier circuit.

A non-inverting input terminal of the first operational amplifier 100 is coupled to a node 27 (output node) between resistors 21, 23 included in a resistor network 20 of the first D/A conversion circuit 11 and an analog signal VA is supplied thereto. An output terminal and an inverting input terminal of the operational amplifier 100 are coupled to each other to serve as a voltage follower. This operational amplifier 100 outputs an analog signal VB having a voltage equal to the signal VA. The output terminal of the operational amplifier 100 is coupled to a first terminal of the switch SW2a and a second terminal of the switch SW2a is coupled to a resistor 46 included in a resistor network 40 of the second D/A conversion circuit 13.

A non-inverting input terminal of the second operational amplifier 110 is coupled to the node 27 (output node) between the resistors 21, 23 included in the resistor network 20 of the first D/A conversion circuit 11 and the analog signal VA is supplied thereto. An output terminal and an inverting input terminal of the operational amplifier 110 are coupled to each other to serve as a voltage follower. This operational amplifier 110 outputs the analog signal VB having a voltage equal to the signal VA. The output terminal of the operational amplifier 110 is coupled to a first terminal of the switch SW2b and a second terminal of the switch SW2a is coupled to the resistor 46 included in the resistor network 40 of the second D/A conversion circuit 13.

Figure 7:
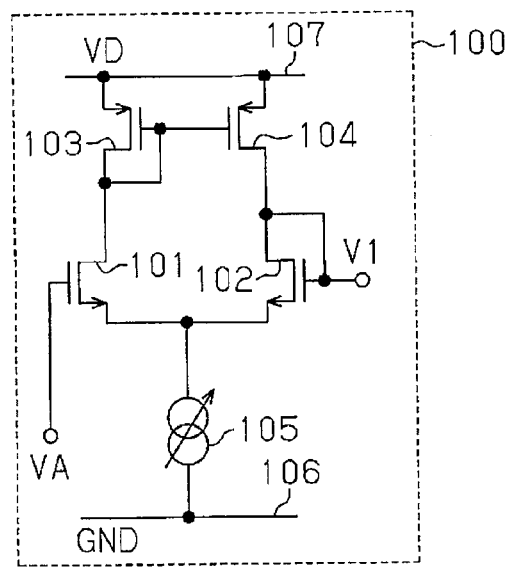
FIG. 7 is a circuit diagram of an operational amplifier.

As illustrated in FIG. 7, the first operational amplifier 100 includes transistors 101 to 104 and a current source 105. The transistors 101, 102 are, for example, N-channel MOS transistors and the transistors 103, 104 are, for example, P-channel MOS transistors. The analog signal VA is applied to a gate terminal of the transistor 101 of a differential pair. A source terminal of the transistor 101 and that of the transistor 102 are coupled to each other; a connection point thereof is coupled to a first terminal of the current source 105 and a second terminal of the current source 105 is coupled to a wiring 106 at a low potential voltage GND level. Drain terminals of the transistors 101, 102 are respectively coupled to those of the transistors 103, 104 and source terminals of the transistors 103, 104 are coupled to a wiring 107 at a high potential voltage VD level. A drain terminal of the transistor 103 is coupled to a gate terminal of the transistor 103 and that of the transistor 104. A gate terminal of the transistor 102 of the differential pair is coupled to the drain terminal of the transistor 102. A signal V1 is output from the drain terminal of the transistor 102 which serves as an output node.

Figure 8:
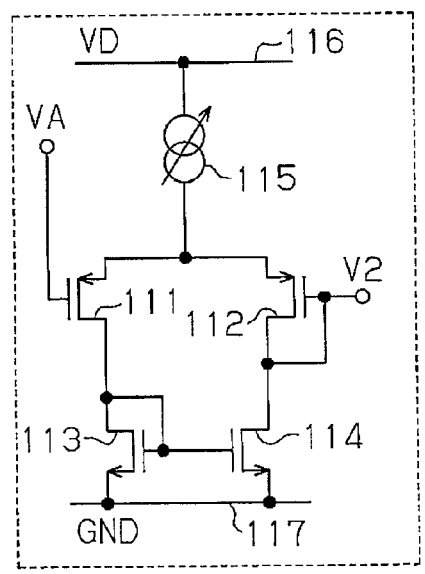
FIG. 8 is a circuit diagram of an operational amplifier.

As illustrated in FIG. 8, the second operational amplifier 110 includes transistors 111 to 114 and a current source 115. The transistors 111, 112 are, for example, P-channel MOS transistors and the transistors 113, 114 are, for example, N-channel MOS transistors. The analog signal VA is applied to a gate terminal of the transistor 111 of a differential pair. A source terminal of the transistor 111 and that of the transistor 112 are coupled to each other, a connection point thereof is coupled to a second terminal of the current source 115 and a first terminal of the current source 115 is coupled to a wiring 116 at the high potential voltage VD level. Drain terminals of the transistors 111, 112 are respectively coupled to those of the transistors 113, 114 and source terminals of the transistors 113, 114 are coupled to a wiring 117 at the low potential voltage GND level. A drain terminal of the transistor 113 is coupled to a gate terminal of the transistor 113 and that of the transistor 114. A gate terminal of the transistor 112 of the differential pair is coupled to the drain terminal of the transistor 112. A signal V2 is output from the drain terminal of the transistor 112 which serves as an output node.

As illustrated in FIG. 9A, the first switch SW2a includes a P-channel MOS transistor 121 and an N-channel MOS transistor 122 coupled in parallel to each other and an inverter circuit 123. A digital input signal D2 is supplied to the inverter circuit 123. This digital input signal D2 is supplied to a gate terminal of the N-channel MOS transistor 122. The inverter circuit 123 outputs a signal S1x obtained by logically inverting the digital input signal D2. This signal S1x is supplied to a gate terminal of the P-channel MOS transistor 121.

As illustrated in FIG. 9B, the second switch SW2b includes a P-channel MOS transistor 124 and an N-channel MOS transistor 125 coupled in parallel to each other and an inverter circuit 126. The digital input signal D2 is supplied to the inverter circuit 126. This digital input signal D2 is supplied to a gate terminal of the P-channel MOS transistor 124. The inverter circuit 126 outputs a signal S2x obtained by logically inverting the digital input signal D2. This signal S2x is supplied to a gate terminal of the N-channel MOS transistor 125.

The first and second switches SW2a, SW2b are complementarily turned on and off in response to the digital input signal D2. For example, if the digital input signal D2 has a logical value "1" (H-level), the first switch SW2a is turned on and the second switch SW2b is turned off. Further, if the digital input signal D2 has a logical value "0" (L-level), the first switch SW2a is turned off and the second switch SW2b is turned on.

The first operational amplifier 100 is an operational amplifier for high voltage having an input permissible range at a high potential voltage VD side in a voltage range between a high potential voltage VD and a low potential voltage GND. The second operational amplifier 110 is an operational amplifier for low voltage having an input permissible range at a low potential voltage GND side in the voltage range between the high potential voltage VD and the low potential voltage GND.

The first D/A conversion circuit 11 illustrated in FIG. 6 generates the analog signal VA having a voltage obtained by dividing a potential difference between the high potential voltage VD and the low potential voltage GND according to digital input signals D2 to D0 of three bits. Accordingly, the first D/A conversion circuit 11 generates the analog signal VA having a voltage value within a range from the high potential voltage VD to an intermediate voltage (=(VD)/2) when the digital input signal D2 is "1" (H-level). Thus, the output signal V1 of the first operational amplifier 100 for high voltage is supplied as the analog signal VB to the second D/A conversion circuit 13 via the switch SW2a which is turned on in response to the H-level digital input signal D2.

Similarly, the first D/A conversion circuit 11 generates the analog signal VA having a voltage value within a range from the intermediate voltage (=(VD)/2) to the low potential voltage GND when the digital input signal D2 is "0" (L-level). Thus, the output signal V2 of the second operational amplifier 110 for low voltage is supplied as the analog signal VB to the second D/A conversion circuit 13 via the switch SW2b which is turned on in response to the L-level digital input signal D2.

A control of the switches SW2a, SW2b in response to digital input signals D5 to D0 and voltage values of the signals VA, VB and an analog signal VOUT are illustrated in FIG. 10. Codes represent binary numbers indicated by the digital input signals D5 to D0 in the form of decimal numbers. Further, the voltage values of the signals VA, VB and the analog signal VOUT are values when the high potential voltage VD=6.40V and the low potential voltage GND=0V.

As described above, according to this embodiment, the following effect is achieved in addition to the effects of the above embodiment.

(3) The buffer circuit 12a includes the first operational amplifier 100 for high voltage and the second operational amplifier 110 for low voltage. The output terminal of the first operational amplifier 100 is coupled to the second D/A conversion circuit 13 via the first switch SW2a. Similarly, the output terminal of the second operational amplifier 110 is coupled to the second D/A conversion circuit 13 via the second switch SW2b. The first and second switches SW2a, SW2b are complementarily turned on and off according to the digital input signal D2.

Accordingly, a connection path is switched by the first and second switches SW2a, SW2b. This enables the use of the simply configured operational amplifiers 100, 110 and may reduce the area of the buffer circuit 12a.

A third embodiment will be described with reference to FIGS. 11 to 14.

In the illustrated embodiment, the same components as in the above embodiments are denoted by the same reference signs and not described.

Figure 11:
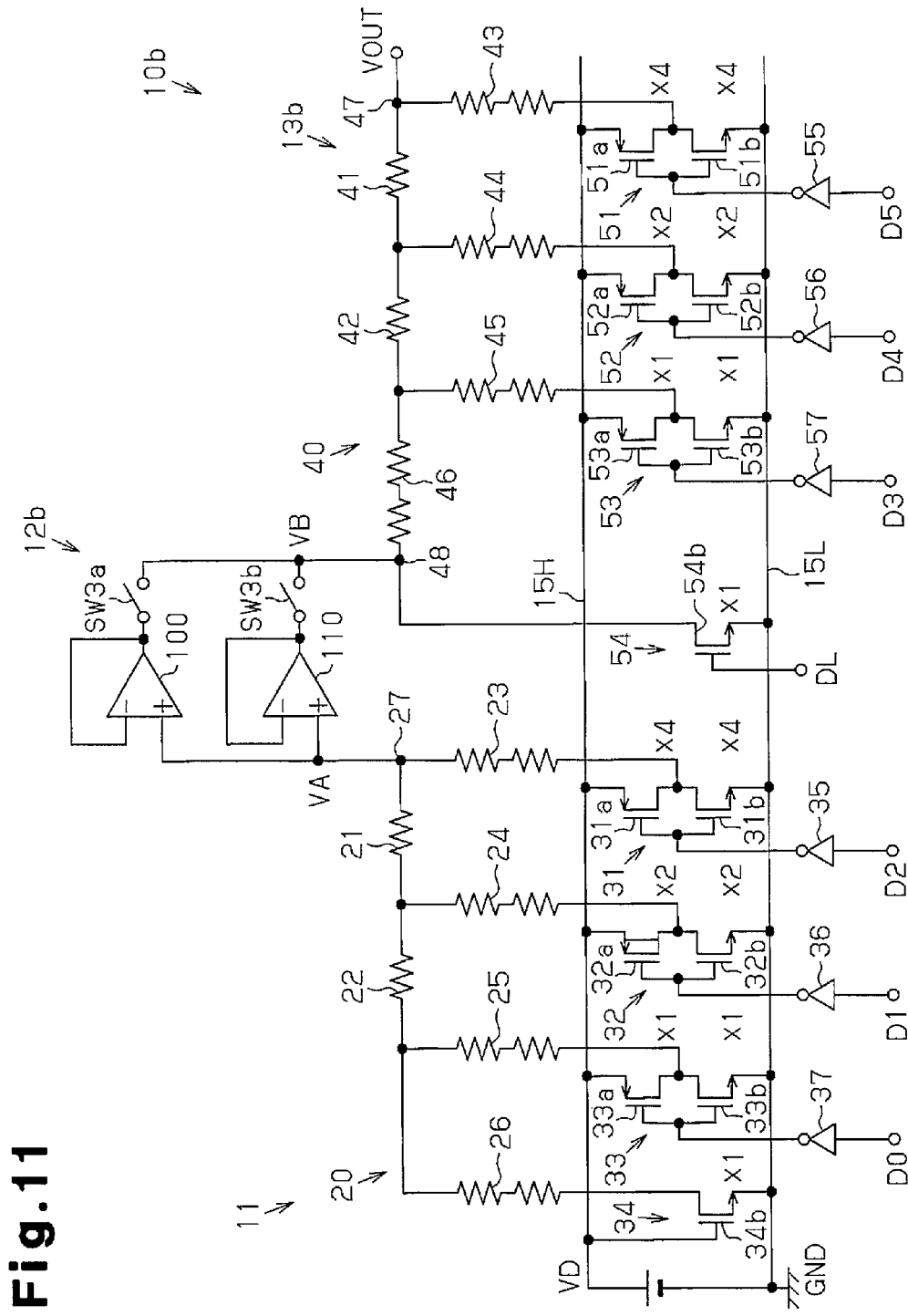
FIG. 11 is a circuit diagram of a D/A converter.

As illustrated in FIG. 11, a D/A converter 10b includes a first D/A conversion circuit 11, a buffer circuit 12b and a second D/A conversion circuit 13b. Further, the D/A converter 10b includes a control signal generation circuit 14b illustrated in FIG. 13.

The second D/A conversion circuit 13b includes a switch 54 coupled between a second terminal (node 48) of a resistor 46 and a wiring 15L at a low potential voltage GND level. This switch 54 includes a transistor 54b. The transistor 54b is, for example, an N-channel MOS transistor. This transistor 54b is formed to have the same size (×1) as a transistor 53b turned on and off by a digital input signal D3 which is a least significant bit in the second D/A conversion circuit 13b.

Figure 13:
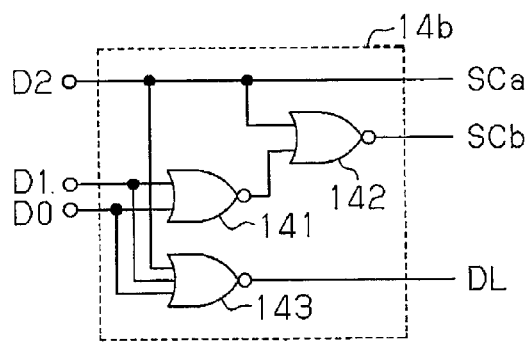
FIG. 13 is a circuit diagram of a control signal generation circuit.

A drain terminal of the transistor 54b is coupled to the second terminal of the resistor 46 and a source terminal is coupled to the wiring 15L. A control signal DL generated by the control signal generation circuit 14b illustrated in FIG. 13 is supplied to a gate terminal of the transistor 54b. The transistor 54b is turned on and off in response to the control signal DL. Thus, the transistor 54b connects and disconnects the resistor 46 and the wiring 15L according to the control signal DL.

Figure 12:
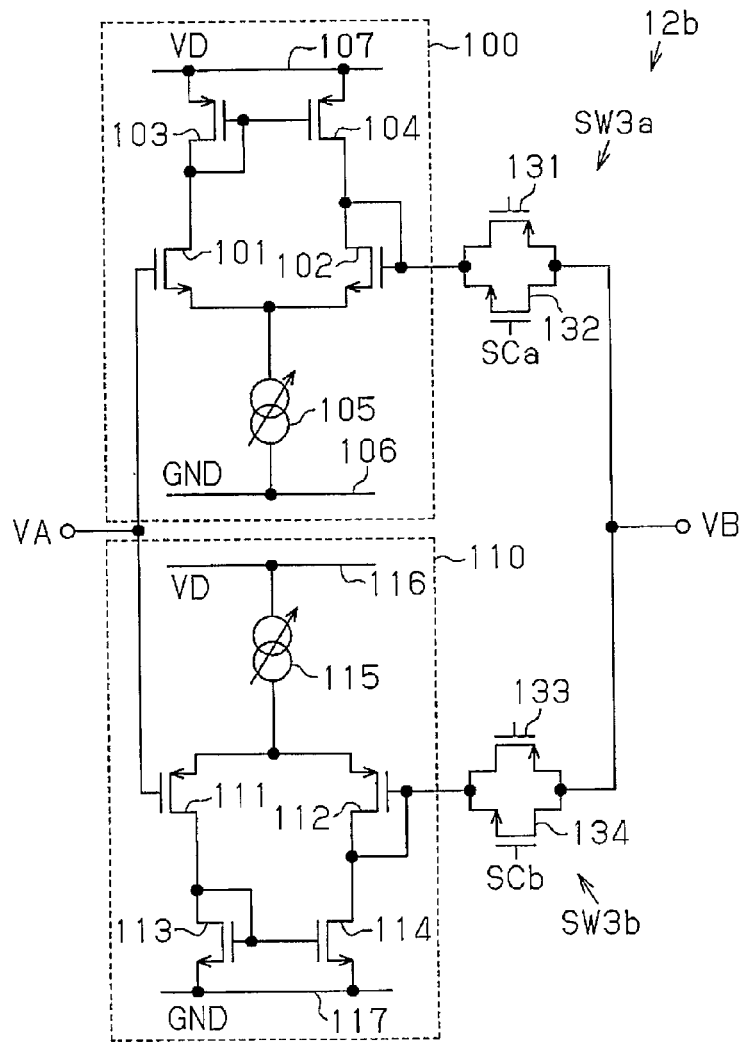
FIG. 12 is a circuit diagram of operational amplifiers and switches.

As illustrated in FIG. 12, a switch SW3a includes a P-channel MOS transistor 131 and an N-channel MOS transistor 132 coupled in parallel to each other. A control signal SCa generated by the control signal generation circuit 14b illustrated in FIG. 13 is supplied to a gate terminal of the transistor 132. For example, the switch SW3a includes an unillustrated inverter circuit and a signal obtained by logically inverting the control signal SCa by this inverter circuit is supplied to a gate terminal of the transistor 131.

Similarly, a switch SW3b includes a P-channel MOS transistor 133 and an N-channel MOS transistor 134 coupled in parallel to each other. A control signal SCb generated by the control signal generation circuit 14b illustrated in FIG. 13 is supplied to a gate terminal of the transistor 134. The switch SW3b includes an unillustrated inverter circuit and a signal obtained by logically inverting the control signal SCb by this inverter circuit is supplied to a gate terminal of the transistor 133.

As illustrated in FIG. 13, the control signal generation circuit 14b outputs the control signal SCa having a level equal to a digital input signal D2. The control signal generation circuit 14b includes NOR circuits 141 to 143. The NOR circuit 141 outputs a signal having a level corresponding to a result of a negative OR operation of digital input signals D1, D0. The NOR circuit 142 outputs the control signal SCb having a level corresponding to a result of a negative OR operation of the digital input signal D2 and an output signal of the NOR circuit 141. The NOR circuit 143 outputs the control signal DL having a level corresponding to a result of a negative OR operation of the digital input signals D2, D1 and D0.

Functions of this D/A converter 10b will be described.

As illustrated in FIG. 11, the resistor 46 included in the second D/A conversion circuit 13b is coupled to the wiring 15L at the low potential voltage GND level via the switch 54. The switch 54 (transistor 54b) is turned on and off in response to the control signal DL.

The control signal generation circuit 14b (NOR circuit 143) illustrated in FIG. 13 outputs an H-level control signal DL when all the digital input signals D2 to D0 are at L-level and outputs an L-level control signal DL unless otherwise (D2=D1=D0=L) as illustrated in FIG. 14.

The switch 54 (transistor 54b) illustrated in FIG. 11 is turned on in response to the H-level control signal DL and turned off in response to the L-level control signal DL. When the switch 54 is turned on, the switches SW3a, SW3b included in the buffer circuit 12b are turned off in response to the control signals SCa, SCb. Thus, the output terminals of the operational amplifiers 100, 110 are disconnected from the resistor 46. In this way, the node 48 of a resistor network included in the second D/A conversion circuit 13b becomes the low potential voltage GND level.

As described above, according to this embodiment, the following effect is achieved in addition to the effects of the above respective embodiments.

(4) The second D/A conversion circuit 13b includes the switch 54 coupled between the node 48 of the resistor network 40 and the wiring 15L at the low potential voltage GND level. The switch 54 includes the transistor 54b having the same size as the transistor 53b which is turned on and off in response to the digital input signal D3.

The control signal generation circuit 14b outputs the H-level control signal DL when all the digital input signals D2 to D0 are at L-level and outputs the L-level control signal DL unless otherwise (D2=D1=D0=L) based on the digital input signals D2 to D0 corresponding to the first D/A converter 11. The transistor 54b is turned on in response to the H-level control signal DL. In this way, the node 48 of the resistor network 40 included in the second D/A conversion circuit 13b may be reliably set at the low potential voltage GND level.

Figure 16:
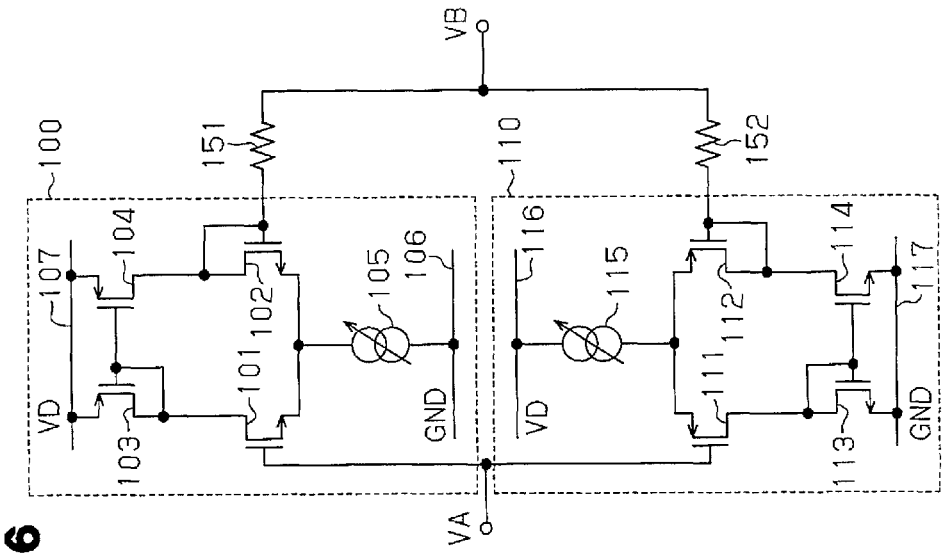
FIG. 16 is an equivalent circuit diagram of the operational amplifiers and the switches.

A fourth embodiment will be described with reference to FIGS. 15 and 16.

In the illustrated embodiment, the same components as in the above embodiments are denoted by the same reference signs and all or some of them are not described.

Figure 15:
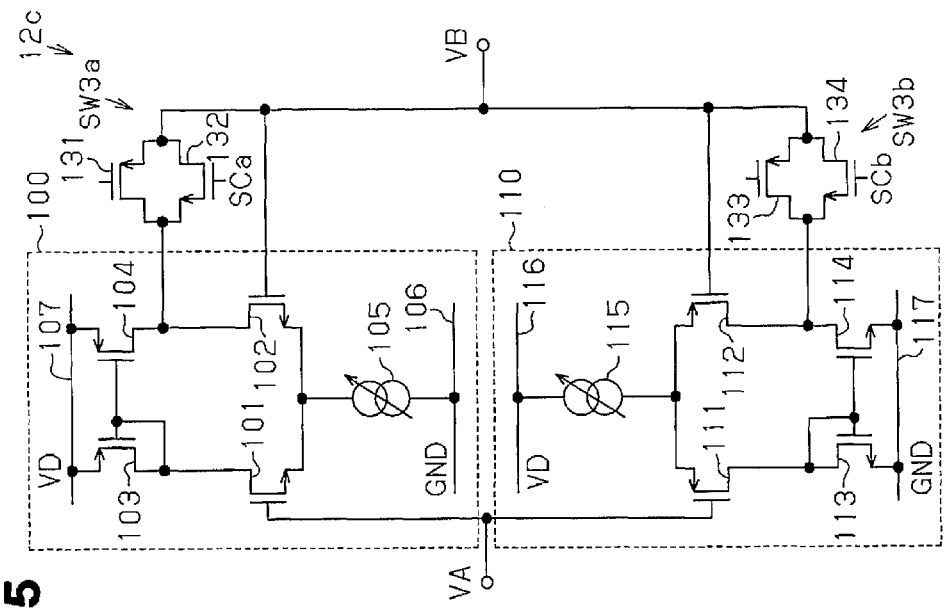
FIG. 15 is a circuit diagram of operational amplifiers and switches.

A buffer circuit 12c illustrated in FIG. 15 is used, for example, in place of the buffer circuit 12b illustrated in FIG. 11. The buffer circuit 12c may be used in place of the buffer circuit 12 illustrated in FIG. 1 or the buffer circuit 12a illustrated in FIG. 6.

This buffer circuit 12c includes operational amplifiers 100, 110 and switches SW3a, SW3b.

The operational amplifier 100 includes transistors 101 to 104 and a current source 105. A drain terminal of the transistor 104 is coupled to a first terminal (left terminal in FIG. 15) of the switch SW3a and a second terminal of the switch SW3a is coupled to a gate terminal of the transistor 102 of a differential pair and a node 48 (see FIG. 11) of a second D/A conversion circuit 13b.

The operational amplifier 110 includes transistors 111 to 114 and a current source 115. A drain terminal of the transistor 114 is coupled to a first terminal (left terminal in FIG. 15) of the switch SW3b and a second terminal of the switch SW3a is coupled to a gate terminal of the transistor 112 of the differential pair and the node 48 (see FIG. 11) of the second D/A conversion circuit 13b.

The gate terminal of the transistor 102 functions as an inverting input terminal of the operational amplifier 100. Thus, a voltage at the node 48 of the second D/A conversion circuit 13b is fed back to the inverting input terminal of this operational amplifier 100. Similarly, the gate terminal of the transistor 112 functions as an inverting input terminal of the operational amplifier 110. Thus, the voltage at the node 48 of the second D/A conversion circuit 13b is fed back to the inverting input terminal of this operational amplifier 110.

For example, as illustrated in FIG. 11, an output terminal of the operational amplifier 100 of a voltage follower circuit is coupled to the inverting input terminal. The output terminal of the operational amplifier 100 is coupled to the node 48 of the second D/A conversion circuit 13b via the switch SW3a. The switch SW3a has an ON-resistance. Thus, the operational amplifiers 100, 110 of the buffer circuit 12b illustrated in FIG. 11 are coupled to the node 48 of the second D/A conversion circuit 13b illustrated in FIG. 11 via resistors 151, 152 (ON-resistance components of the switches SW3a, SW3b) as illustrated in an equivalent circuit of FIG. 16. A current from the second D/A conversion circuit 13b flows into these resistors 151, 152. As a result, a potential difference is created between both terminals of the resistors 151, 152, wherefore the operational amplifiers 100, 110 do not become low impedance when viewed from the second D/A conversion circuit 13b.

Contrary to this, in a D/A converter to which the buffer circuit 12c of this embodiment is applied, the gate terminals of the transistors 102, 112 functioning as the inverting input terminals of the operational amplifiers 100, 110 included in the buffer circuit 12c are coupled to the node 48 (see FIG. 11) of the second D/A conversion circuit 13b. Thus, voltages fed back to the gate terminals of the respective transistors 102, 112 are not affected by resistance components of the switches SW3a, SW3b. This makes the respective operational amplifiers 100, 110 become low impedance when viewed from the second D/A conversion circuit 13b.

As described above, according to this embodiment, the following effect is achieved in addition to the effects of the above respective embodiments.

(5) The output terminal of the operational amplifier 100 for high voltage is coupled to the first terminal of the switch SW3a and the second terminal of the switch SW3a is coupled to the second D/A conversion circuit 13b and the inverting input terminal of the operational amplifier 100. The output terminal of the operational amplifier 110 for low voltage is coupled to the first terminal of the switch SW3b and the second terminal of the switch SW3b is coupled to the second D/A conversion circuit 13b and the inverting input terminal of the operational amplifier 110. Thus, voltages fed back to the gate terminals of the transistors 102, 112 functioning as the inverting input terminals of the operational amplifiers 100, 110 are not affected by the resistance components of the switches SW3a, SW3b. This makes the respective operational amplifiers 100, 110 become low impedance when viewed from the second D/A conversion circuit 13b and an analog signal VOUT corresponding to the configuration of the second D/A conversion circuit 13b may be generated.

A fifth embodiment will be described with reference to FIGS. 17 to 23.

In the illustrated embodiment, the same components as in the above embodiments are denoted by the same reference signs and all or some of them are not described.

Figure 17:
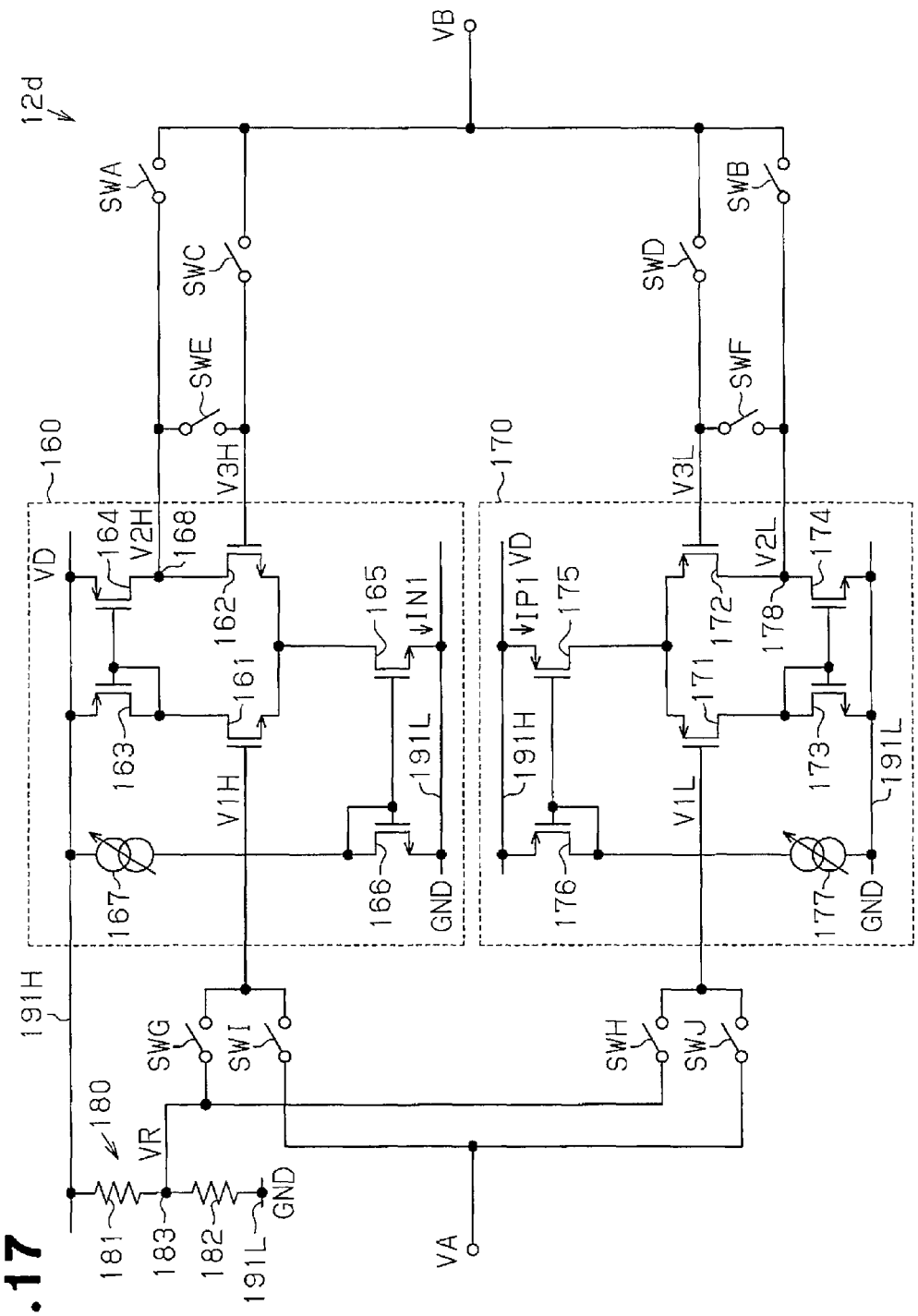
FIG. 17 is a circuit diagram of operational amplifiers and switches.

A buffer circuit 12*d* illustrated in FIG. 17 is used, for example, in place of the buffer circuit 12*b* illustrated in FIG. 11. The buffer circuit 12*d* may be used in place of the buffer circuit 12 illustrated in FIG. 1 or the buffer circuit 12*a* illustrated in FIG. 6. A D/A converter including this buffer circuit 12*d* includes a control signal generation circuit 14*d* illustrated in FIG. 18.

As illustrated in FIG. 17, the buffer circuit 12*d* includes operational amplifiers (amplifier circuits) 160, 170, a reference voltage generation circuit 180 and switches SWA to SWJ.

An analog signal VA is supplied to first terminals of the switches SWI, SWJ. A second terminal of the switch SWI is coupled to the operational amplifier 160 and that of the switch SWJ is coupled to the operational amplifier 170.

The operational amplifier 160 includes transistors 161, 162 of a differential pair. The transistors 161, 162 are, for example, N-channel MOS transistors. A gate terminal of the transistor 161 is coupled to the second terminal of the switch SWI.

Drain terminals of the transistors 161, 162 are respectively coupled to transistors 163, 164. The transistors 163, 164 are, for example, P-channel MOS transistors. A drain terminal of the transistor 163 is coupled to that of the transistor 161 and a drain terminal of the transistor 164 is coupled to that of the transistor 162. Source terminals of the transistors 163, 164 are coupled to a wiring 191H. Further, the drain terminal of the transistor 163 is coupled to gate terminals of the transistors 163, 164.

Source terminals of the transistors 161, 162 are coupled to each other and a connection point thereof is coupled to a transistor 165. The transistor 165 is, for example, an N-channel MOS transistor. A drain terminal of the transistor 165 is coupled to the source terminals of the transistors 161, 162 and a source terminal thereof is coupled to a wiring 191L. A gate terminal of the transistor 165 is coupled to a transistor 166.

The transistor 166 is, for example, an N-channel MOS transistor. A source terminal of the transistor 166 is coupled to the wiring 191L. A drain terminal of the transistor 166 is coupled to gate terminals of the transistors 165, 166. Further, the drain terminal of the transistor 166 is coupled to a second terminal of a current source 167 and a first terminal of the current source 167 is coupled to the wiring 191H.

An output node 168 between the drain terminal of the transistor 162 and that of the transistor 164 is coupled to a first terminal of the switch SWA and a second terminal of the switch SWA is coupled to a node 48 (see FIG. 11) of a second D/A conversion circuit 13*b*. A first terminal of the switch SWE is coupled to the first terminal of the switch SWA and a second terminal thereof is coupled to a gate terminal of the transistor 162 of the differential pair and a first terminal of the switch SWC. A second terminal of the switch SWC is coupled to the second terminal of the switch SWA.

The operational amplifier 170 includes transistors 171, 172 of a differential pair. The transistors 171, 172 are, for example, P-channel MOS transistors. A gate terminal of the transistor 171 is coupled to the second terminal of the switch SWJ.

Drain terminals of the transistors 171, 172 are respectively coupled to transistors 173, 174. The transistors 173, 174 are, for example, N-channel MOS transistors. A drain terminal of the transistor 173 is coupled to that of the transistor 171 and a drain terminal of the transistor 174 is coupled to that of the transistor 172. Source terminals of the transistors 173, 174 are coupled to the wiring 191L. Further, the drain terminal of the transistor 173 is coupled to gate terminals of the transistors 173, 174.

Source terminals of the transistors 171, 172 are coupled to each other and a connection point thereof is coupled to a transistor 175. The transistor 175 is, for example, a P-channel MOS transistor. A drain terminal of the transistor 175 is coupled to the source terminals of the transistors 171, 172 and a source terminal thereof is coupled to the wiring 191H. A gate terminal of the transistor 175 is coupled to a transistor 176.

The transistor 176 is, for example, a P-channel MOS transistor. A source terminal of the transistor 176 is coupled to the wiring 191H. A drain terminal of the transistor 176 is coupled to gate terminals of the transistors 175, 176. Further, the drain terminal of the transistor 176 is coupled to a first terminal of a current source 177 and a second terminal of the current source 177 is coupled to the wiring 191L.

An output node 178 between the drain terminal of the transistor 172 and that of the transistor 174 is coupled to a first terminal of the switch SWB and a second terminal of the switch SWB is coupled to the node 48 (see FIG. 11) of the second D/A conversion circuit 13*b*. A first terminal of the switch SWF is coupled to the first terminal of the switch SWB and a second terminal thereof is coupled to a gate terminal of the transistor 172 of the differential pair and a first terminal of the switch SWD. A second terminal of the switch SWD is coupled to the second terminal of the switch SWB.

The reference voltage generation circuit 180 includes two resistors 181, 182 coupled in series between the wiring 191H at a high potential voltage VD level and the wiring 191L at a low potential voltage GND level. The both resistors 181, 182 are set to have the same resistance value. Thus, the reference voltage generation circuit 180 generates a reference voltage VR having a value obtained by dividing a potential difference between a high potential voltage VD and a low potential voltage GND by the resistance value of the resistors 181, 182 at a node 183 between the both resistors 181, 182. The node 183 is coupled to first terminals of the SWG, SWH. A second terminal of the switch SWG is coupled to the gate terminal of the transistor 161 of the operational amplifier 160. A second terminal of the switch SWH is coupled to the gate terminal of the transistor 171 of the operational amplifier 170. The switches SWI, SWJ are an example of a first switching circuit and the switches SWG, SWH are an example of a second switching circuit.

Figures 18, 19:
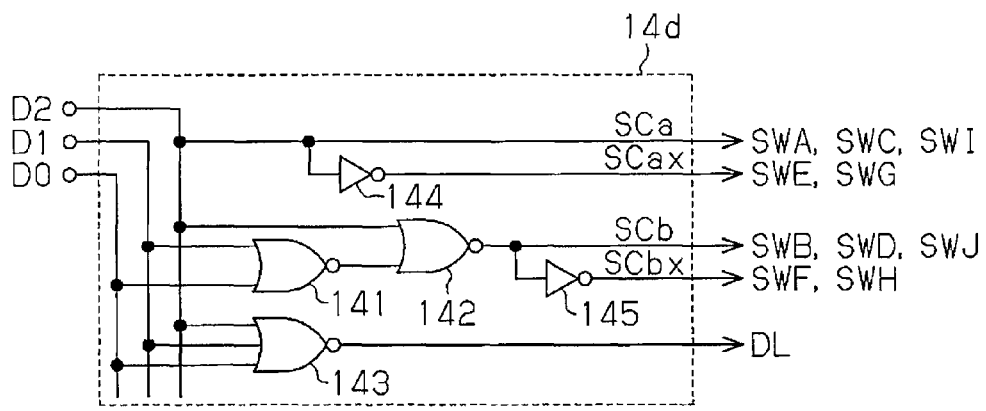
FIG. 18 is a circuit diagram of a control signal generation circuit.
FIG. 19 is a table indicating the operation of the control signal generation circuit.

A control signal generated by the control signal generation circuit 14*d* illustrated in FIG. 18 is supplied to respective switches SWA to SWJ. Respective switches SWA to SWJ are, for example, similar to the switch SW2*a* illustrated in FIG. 9A and turned on in response to an H-level control signal and turned off in response to an L-level control signal.

The control signal generation circuit 14*d* includes NOR circuits 141 to 143 and inverter circuits 144, 145. The inverter circuit 144 outputs a control signal SCax having a level obtained by logically inverting a digital input signal D2 (control signal SCa). The inverter circuit 145 outputs a control signal SCbx having a level obtained by logically inverting the control signal SCb output from the NOR circuit 142. Logic levels of the respective control signals SCa, SCax, SCb, and SCbx in response to the digital input signals D2 to D0 are illustrated in FIG. 19.

The control signal SCa is supplied to the switches SWA, SWC and SWI illustrated in FIG. 17. The control signal SCax is supplied to the switches SWE, SWG illustrated in FIG. 17.

The control signal SCb is supplied to the switches SWB, SWD and SWJ illustrated in FIG. 17. The control signal SCbx is supplied to the switches SWF, SWH illustrated in FIG. 17.

States of the respective switches SWA to SWJ in response to the digital input signals D2 to D0 are illustrated in FIG. 20.

The operation of the buffer circuit 12d will be described based on logical values of the digital input signals D2 to D0.

Case [1] where the digital input signals D2 to D0 are [000].

At this time, as illustrated in FIG. 20, the switches SWA, SWB, SWC, SWD, SWI and SWJ are turned off and the switches SWE, SWF, SWG and SWH are turned on.

Accordingly, as illustrated in FIG. 17, an output terminal (drain terminal of the transistor 164) and an inverting input terminal (gate terminal of the transistor 162) of the operational amplifier 160 for high voltage are disconnected from the node 48 illustrated in FIG. 11 by turning off the switches SWA, SWC. Similarly, an output terminal (drain terminal of the transistor 174) and an inverting input terminal (gate terminal of the transistor 172) of the operational amplifier 170 for low voltage are disconnected from the node 48 illustrated in FIG. 11 by turning off the switches SWB, SWD. Then, the switch 54 (transistor 54b) illustrated in FIG. 11 is turned on by an H-level control signal DL generated by the control signal generation circuit 14b of FIG. 18. In this way, the second D/A conversion circuit 13b sets the low potential voltage GND level as an offset voltage and outputs an analog signal VOUT having a voltage value obtained by dividing the potential difference between the high potential voltage VD and the low potential voltage GND according to digital input signals D5 to D3.

The reference voltage VR is supplied to a non-inverting input terminal (gate terminal of the transistor 161) of the operational amplifier 160 for high voltage illustrated in FIG. 17 via the turned-on switch SWG. Further, the output terminal (drain terminal of the transistor 164) and the inverting input terminal (gate terminal of the transistor 162) of the operational amplifier 160 are coupled to each other by the turned-on switch SWE. Thus, the operational amplifier 160 operates to make a gate terminal voltage V3H of the transistor 162 equal to the reference voltage VR.

Similarly, the reference voltage VR is supplied to a non-inverting input terminal (gate terminal of the transistor 171) of the operational amplifier 170 for low voltage via the turned-on switch SWH. Further, the output terminal (drain terminal of the transistor 174) and the inverting input terminal (gate terminal of the transistor 172) of the operational amplifier 170 are coupled to each other by the turned-on switch SWF. Thus, the operational amplifier 170 operates to make a gate terminal voltage V3L of the transistor 172 equal to the reference voltage VR.

Case [2] where the digital input signals D2 to D0 are [001] to [011].

At this time, as illustrated in FIG. 20, the switches SWA, SWC and SWI are turned off and the switches SWE, SEG are turned on. Accordingly, as illustrated in FIG. 17, the reference voltage VR is supplied to the non-inverting input terminal (gate terminal of the transistor 161) of the operational amplifier 160 for high voltage via the turned-on switch SWG. Further, the output terminal (drain terminal of the transistor 164) and the inverting input terminal (gate terminal of the transistor 162) of the operational amplifier 160 are disconnected from the node 48 illustrated in FIG. 11 by turning off the switches SWA, SWC. Then, the output terminal and the inverting input terminal of the operational amplifier 160 are coupled to each other by the turned-on switch SWE. In this way, the operational amplifier 160 operates to make a voltage at the inverting input terminal (gate terminal of the transistor 162) equal to the reference voltage VR.

Further, as illustrated in FIG. 20, the switches SWB, SWD and SWJ are turned on and the switches SWF, SWH are turned off. Accordingly, as illustrated in FIG. 17, an analog signal VA is supplied to the non-inverting input terminal (gate terminal of the transistor 171) of the operational amplifier 170 for low voltage. Further, the output terminal (drain terminal of the transistor 174) and the inverting input terminal (gate terminal of the transistor 172) of the operational amplifier 170 are coupled to the node 48 illustrated in FIG. 11. In this way, the operational amplifier 170 for low voltage outputs an analog signal VB having a voltage value equal to the analog signal VA.

Case [3] where the digital input signals D2 to D0 are [100] to [111].

At this time, as illustrated in FIG. 20, the switches SWA, SWC and SWI are turned on and the switches SWE, SEG are turned off. Further, the switches SWB, SWD and SWJ are turned off and the switches SWF, SEH are turned on. For example, in the case [3], the respective switches SWA to SWJ are complementarily turned on and off as compared with the case [2]. Thus, in the case [3], the operational amplifier 160 for high voltage outputs the analog signal VB having a voltage value equal to the analog signal VA. On the other hand, the operational amplifier 170 for low voltage operates to make a voltage at the inverting input terminal (gate terminal of the transistor 172) equal to the reference voltage VR.

Logics of the control signal DL and voltage values in the buffer circuit 12d in response to the digital input signals D2 to D0 are illustrated in FIG. 21. In FIG. 21 "For High" indicates the operational amplifier 160 for high voltage and "For Low" indicates the operational amplifier 170 for low voltage. Further, "Input Gate" indicates the gate terminals of the transistors 161, 171 at an input side in the operational amplifiers 160, 170, "Output Drain" indicates the drain terminals of the transistors 164, 174 at an output side, and "Output Gate" indicates the gate terminals of the transistors 162, 172 at the output side. The voltage values illustrated in FIG. 21 are values when the high potential voltage VD=6.40V and the low potential voltage GND=0V.

Since the reference voltage VR is 3.20V and the analog signal VA is likewise 3.20V, terminal voltages set by the reference voltage VR are denoted as "VR" to distinguish the both. Further, terminal voltages depending on the digital input signals D5 to D3 (see FIG. 11) are denoted as "Fv"

As described above, the reference voltage VR is supplied to the transistor 161 of the operational amplifier 160 when the digital input signals D2 to D0 of the lower three bits are [001] to [011], and the reference voltage VR is supplied to the transistor 171 of the operational amplifier 170 when they are [100] to [111]. These enable the operating speed of the buffer circuit 12d, consequently the operating speed of the D/A converter including the buffer circuit 12d to be increased.

Figure 22:
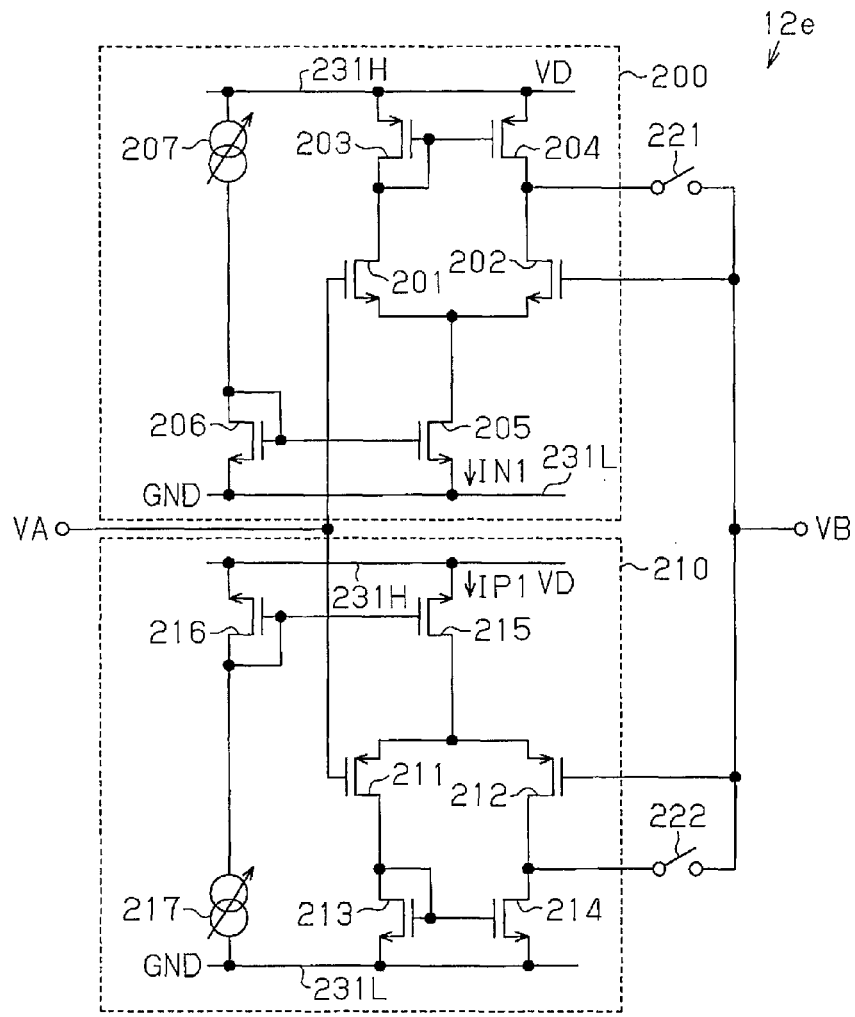
FIG. 22 is a circuit diagram of operational amplifiers and switches.

FIG. 22 is a circuit diagram of a buffer circuit 12e as a comparative example. This buffer circuit 12e includes operational amplifiers 200, 210 and switches 221, 222. The first operational amplifier 200 includes transistors 201 to 206 and a current source 207 coupled between a wiring 231H at the high potential voltage VD level and a wiring 231L at the low potential voltage GND level, and these are coupled in a manner similar to the transistors 161 to 166 and the current source 167 of the operational amplifier 160 illustrated in FIG. 17. Further, the operational amplifier 210 includes transistors 211 to 216 and a current source 217 coupled between the wiring 231H at the high potential voltage VD level and the wiring 231L at the low potential voltage GND level, and these are coupled in a manner similar to the transistors 171 to 176 and the current source 177 of the operational amplifier 170 illustrated in FIG. 17. The switches 221, 222 are, for example, similar to the switch SW2a illustrated in FIG. 9A.

The buffer circuit 12e illustrated in FIG. 22 is similar to the buffer circuit 12c illustrated in FIG. 15. Thus, as with the buffer circuit 12c, a D/A converter including the buffer circuit 12e may be formed.

In the operational amplifier 200, a source terminal of the transistor 205 for allowing a bias current IN1 to flow to the transistors 201, 202 of a differential pair is coupled to the wiring 231L at the low potential voltage GND level, and a drain terminal of the transistor 205 is coupled to source terminals of the both transistors 201, 202. An analog signal VA is supplied to the gate terminal of the transistor 201 and an analog signal VB is fed back to the gate terminal of the transistor 202.

When the bias current IN1 is supplied to the transistors 201, 202 of the differential pair, a source terminal voltage of the transistor 201 changes according to a voltage of the analog signal VA. Since the source terminal of the transistor 201 is coupled to the drain terminal of the transistor 205, a drain terminal voltage of the transistor 205 changes according to a voltage value of the analog signal VA.

When the voltage value of the analog signal VA approaches a voltage level of the low potential voltage GND, the source terminal voltage of the transistor 201, i.e. the drain terminal voltage of the transistor 205 decreases according to the analog signal VA. When a voltage between the source terminal and the drain terminal of the transistor 205 becomes smaller than a voltage set according to electrical characteristics (threshold voltage, etc.) of the transistor 205, the amount of the current IN1 flowing in the transistor 205 decreases.

Figure 23:
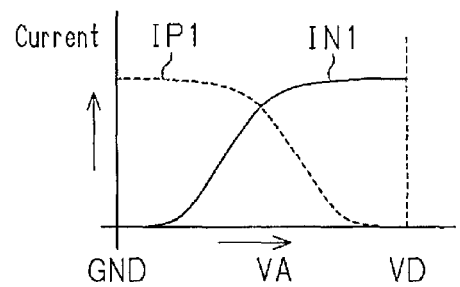
FIG. 23 is an operation characteristic graph of the operational amplifier.

Accordingly, the bias current IN1 flowing in the transistor 205 decreases with a reduction in the voltage of the analog signal VA as illustrated by solid line in FIG. 23, wherefore the operational amplifier 200 stops. Similarly, a bias current IP1 flowing in the transistor 215 decreases with an increase in the voltage of the analog signal VA as illustrated by broken line in FIG. 23, wherefore the operational amplifier 210 stops. Waveforms indicating a voltage-current characteristic in FIG. 23 schematically represent changes in the amount of current.

For example, when a high analog signal VA is supplied by changing the digital input signals D2 to D0, the bias current IN1 flowing in the transistor 205 increases according to a change of the analog signal VA and the operational amplifier 200 stopped by a low analog signal VA recovers its function. Thus, the operational amplifier 200 recovers its function by the change of the digital input signals D2 to D0 and a time until the output of the analog signal VB equal to the analog signal VA limits the operating speed of the D/A converter. That is, this time becomes a factor in preventing an increase in the operating speed of the D/A converter.

Contrary to this, the buffer circuit 12d illustrated in FIG. 17 generates the reference voltage VR, which is half the high potential voltage VD, by the reference voltage generation circuit 180, and this reference voltage VR and the analog signal VA are complementarily supplied to the operational amplifier 160 for high voltage and the operational amplifier 170 for low voltage according to the digital input signals D2 to D0. For example, when the reference voltage VR is supplied to the operational amplifier 160 for high voltage, the transistor 165 of the operational amplifier 160 allows the bias current IN1 to flow to the differential pair of the transistors 161, 162 without being limited by the analog signal VA. Similarly, when the reference voltage VR is supplied to the operational amplifier 170 for low voltage, the transistor 175 allows the bias current IP1 to flow to the differential pair of the transistors 171, 172 without being limited by the analog signal VA.

In this way, when the analog signal VA is supplied, for example, to the operational amplifier 160 for high voltage in response to the digital input signals D2 to D0, a time required until the output of the analog signal VB having a voltage value equal to that analog signal VA is shorter than that required for the operational amplifier 200 illustrated in FIG. 22. Thus, a time required for the output of an analog signal VOUT having a voltage corresponding to the digital input signals D5 to D0 from the second D/A conversion circuit 13b illustrated in FIG. 11 becomes shorter and the operating speed of the D/A converter may be increased.

As described above, according to this embodiment, the following effect is achieved in addition to the effects of the above respective embodiments.

(6) The reference voltage generation circuit 180 is included to generate the reference voltage VR having a voltage value between the high potential voltage VD and the low potential voltage GND. The switches SWG to SWJ are controlled to complementarily supply the reference voltage VR and the analog signal VA output from the first D/A conversion circuit 11 to the operational amplifier 160 for high voltage and the operational amplifier 170 for low voltage. In this way, the operational amplifier to which the analog signal VA is not supplied is stably operated by the reference voltage VR. As a result of this, the respective operational amplifiers 160, 170 wait in an operable state, wherefore a time until the analog signal VB having a voltage value equal to the analog signal VA is supplied to the second D/A conversion circuit 13b in response to a change in the digital input signals D2 to D0 becomes shorter and the operating speed of the D/A converter may be increased.

The aforementioned embodiments may be modified as follows.

Although the first D/A conversion circuit 11 and the second D/A conversion circuits 13, 13b are 3-bit R-2R ladder resistor type D/A conversion circuits, the bit numbers of the respective D/A conversion circuits 11, 13 and 13b may be appropriately changed. Further, the bit number of the first D/A conversion circuit 11 and those of the second D/A conversion circuits 13, 13b may be, for example, mutually different values such as lower three bits and upper five bits or lower four bits and upper three bits.

Although respective D/A converters 10, 10a, 10b include two R-2R ladder resistor type D/A conversion circuits (first D/A conversion circuit 11 and second D/A conversion circuit 13, 13b), they may include three or more R-2R ladder resistor type D/A conversion circuits.

Although the resistance values of the resistors 21, 22 of the first D/A conversion circuit 11 and those of the resistors 41, 42 of the second D/A conversion circuit 13 are respectively "R", they may be mutually different values. Similarly, the resistance values of the resistors 23 to 26 and those of the resistors 43 to 46 may be mutually different values.

Although the switches SW2a, SW2b have a CMOS structure in the second embodiment, the switch SW2a coupled to the operational amplifier 100 for high voltage may be a P-channel MOS transistor and the switch SW2b coupled to the operational amplifier 110 for low voltage may be an N-channel MOS transistor.

In the fifth embodiment, the voltage (gate voltage of the differential pair) supplied to the first operational amplifier 160 and the voltage (gate voltage of the differential pair) supplied to the second operational amplifier 170 may be set to have mutually different voltage values.

Although the high potential voltage VD is 6.40V and the low potential voltage GND is 0V in the above respective embodiments, the respective voltage values may be appropriately changed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A digital-to-analog (D/A) converter generating an analog signal corresponding to a digital input signal, the D/A converter comprising:
   a plurality of D/A conversion circuits; and
   an amplifier circuit coupled between the plurality of D/A conversion circuits in a negative feedback manner; wherein:
   the plurality of D/A conversion circuits include a first-stage D/A conversion circuit configured to receive a multi-bit digital input signal including a least significant bit of the digital input signal, and another D/A conversion circuit configured to receive a higher-order bit than a bit of a digital input signal received by a previous-stage D/A conversion circuit thereof, and
   each D/A conversion circuit includes:
      an R-2R ladder type resistor network corresponding to the digital input signal received by the D/A conversion circuit,
      a plurality of first transistors which are coupled between the resistor network and a first wiring at a first voltage level and the sizes of which are set at a ratio of powers of 2, and
      a plurality of second transistors which are coupled between the resistor network and a second wiring at a second voltage level, the sizes of which are set at a ratio of powers of 2 and which are respectively turned on and off complementarily to the plurality of first transistors according to the digital input signal.

2. The D/A converter according to claim 1, wherein:
   each R-2R ladder type resistor network includes:
      a plurality of first resistors coupled in series between a first node and an output node,
      a plurality of second resistors set to have resistance values twice larger than those of the first resistors, having first terminals coupled to the first resistors and corresponding to the bit number of an input digital signal, and
      a third resistor set to have a resistance value equal to the second resistors and having a first terminal coupled to the first node;
   the second voltage is supplied to a second terminal of the third resistor of the first-stage D/A conversion circuit; and
   an output signal of the amplifier circuit is supplied to the second terminal of the third resistor of the other D/A conversion circuit.

3. The D/A converter according to claim 1, wherein:
   the amplifier circuit includes:
      a first amplifier circuit for high voltage to which an analog signal output from the previous-stage D/A conversion circuit is supplied and which is coupled in a negative feedback manner,
      a second amplifier circuit for low voltage to which the analog signal output from the previous-stage D/A conversion circuit is supplied and which is coupled in a negative feedback manner,
      a first switch which is coupled between an output terminal of the first amplifier circuit and a next-stage D/A conversion circuit, and
      a second switch which is coupled between an output terminal of the second amplifier circuit and the next-stage D/A conversion circuit; and
   the first and second switches are complementarily turned on and off according to a most significant bit of a digital input signal corresponding to the previous-stage D/A conversion circuit.

4. The D/A converter according to claim 2, wherein:
   the amplifier circuit includes:
      a first amplifier circuit for high voltage to which an analog signal output from the previous-stage D/A conversion circuit is supplied and which is coupled in a negative feedback manner,
      a second amplifier circuit for low voltage to which the analog signal output from the previous-stage D/A conversion circuit is supplied and which is coupled in a negative feedback manner,
      a first switch which is coupled between an output terminal of the first amplifier circuit and a next-stage D/A conversion circuit, and
      a second switch which is coupled between an output terminal of the second amplifier circuit and the next-stage D/A conversion circuit;
   the plurality of D/A conversion circuits include third transistors coupled between the first node and the second wiring and having the same size as the second transistors which respond to a least significant bit of a corresponding digital input signal;
   a gate terminal of the third transistor of the first-stage D/A conversion circuit is coupled to the first wiring;
   a control signal generation circuit is included which generates a control signal to be supplied to a gate terminal of the third transistor included in the next-stage D/A conversion circuit according to a digital input signal corresponding to the previous-stage D/A conversion circuit and a control signal for controlling the first and second switches; and
   the first and second switches are complementarily turned on and off according to a most significant bit of a digital input signal corresponding to the previous-stage D/A conversion circuit.

5. The D/A converter according to claim 3, wherein the amplifier circuit includes:
   a first switching circuit which supplies the analog signal output from the previous-stage D/A conversion circuit to either one of the first and second amplifier circuits according to the digital input signal corresponding to the previous-stage D/A conversion circuit;
   a reference voltage generation circuit which generates a reference voltage having a voltage value between the first voltage and the second voltage;
   a second switching circuit which supplies the reference voltage to the first and second amplifier circuits complementarily to the analog signal; and
   a control signal generation circuit which generates a control signal for controlling the first and second switching circuits based on the digital input signal corresponding to the previous-stage D/A conversion circuit.

6. The D/A converter according to claim 1, wherein:
the first transistors of each D/A conversion circuit have different sizes,
the plurality of second transistors of each D/A conversion circuit have different sizes,
the first transistors of the first-stage D/A conversion circuit have the same sizes as the first transistors of the another D/A conversion circuit, respectively; and
the second transistors of the first-stage D/A conversion circuit have the same sizes as the second transistors of the another D/A conversion circuit, respectively.

* * * * *